US009354273B2

(12) United States Patent
Stevenson et al.

(10) Patent No.: US 9,354,273 B2
(45) Date of Patent: May 31, 2016

(54) COMPOSITE WIRE PROBE TEST ASSEMBLY

(71) Applicant: Intel Corporation, Santa Clara, CA (US)

(72) Inventors: Kip Stevenson, Hillsboro, OR (US);
Todd P. Albertson, Chandler, AZ (US);
David Shia, Hillsboro, OR (US); Kamil Salloum, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 412 days.

(21) Appl. No.: 13/725,255

(22) Filed: Dec. 21, 2012

(65) Prior Publication Data
US 2014/0176172 A1    Jun. 26, 2014

(51) Int. Cl.
*G01R 31/28* (2006.01)
*G01R 3/00* (2006.01)
*G01R 1/067* (2006.01)

(52) U.S. Cl.
CPC .............. *G01R 31/2886* (2013.01); *G01R 3/00* (2013.01); *G01R 1/06755* (2013.01)

(58) Field of Classification Search
CPC ... G01R 31/2886; G01R 3/00; G01R 1/06755
USPC .................................................. 324/754.03
See application file for complete search history.

(56) References Cited

U.S. PATENT DOCUMENTS

| 3,844,909 | A | * | 10/1974 | McCary et al. | ............... 205/138 |
| 2008/0204062 | A1 | * | 8/2008 | Tran et al. | ..................... 324/762 |
| 2010/0237889 | A1 | * | 9/2010 | Desta et al. | ................... 324/757 |
| 2012/0199887 | A1 | * | 8/2012 | Chan et al. | ..................... 257/288 |

OTHER PUBLICATIONS

Multicore, Properties of Solder, 2000, p. 1-4.*
Indium Corporation, Gold Solders, 2015, p. 1-3.*
Wilkipedia—Solder mask, 2015, p. 1.*
"Composite Wire Probes for Testing Integrated Circuit", U.S. Appl. No. 13/631,599, filed Sep. 28, 2012.

* cited by examiner

*Primary Examiner* — Thomas F Valone
(74) *Attorney, Agent, or Firm* — Schwegman Lundberg & Woessner, P.A.

(57) ABSTRACT

An examples includes a substrate, including a conductive trace and a layer disposed on top of the conductive trace, the layer defining at least one cavity extending to the conductive trace and an electrical probe disposed in the cavity, with solder coupling the electrical probe to the conductive trace. The electrical probe can include a high yield strength wire core including a refractory metal and a thin oxidation protection layer concentrically disposed around high yield strength wire core and providing an outside surface of the electrical probe, the thin oxidation protection layer including predominantly one or more materials selected from gold, platinum, ruthenium, rhodium, palladium, osmium, iridium, chromium, and combinations thereof, wherein the solder fills the cavity and is coupled to the electrical probe inside the cavity, disposed between the electrical probe and the layer.

11 Claims, 16 Drawing Sheets

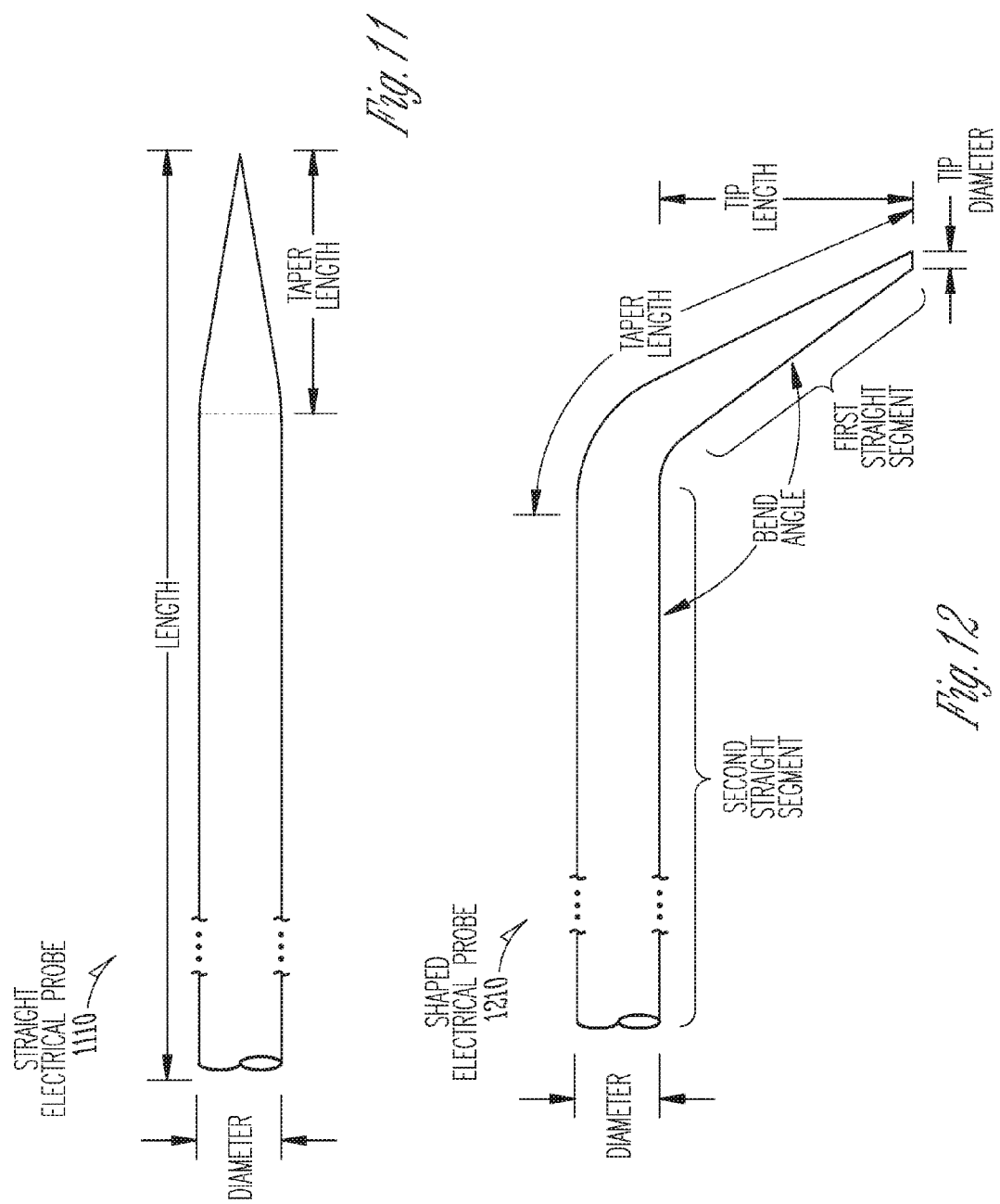

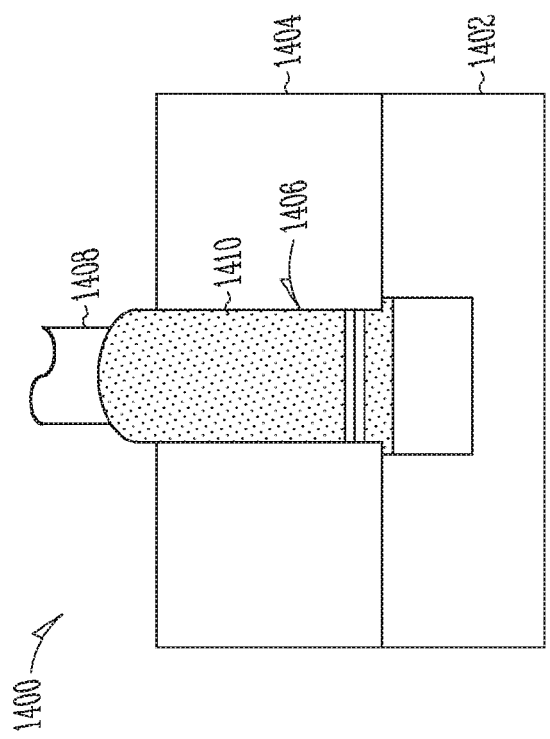
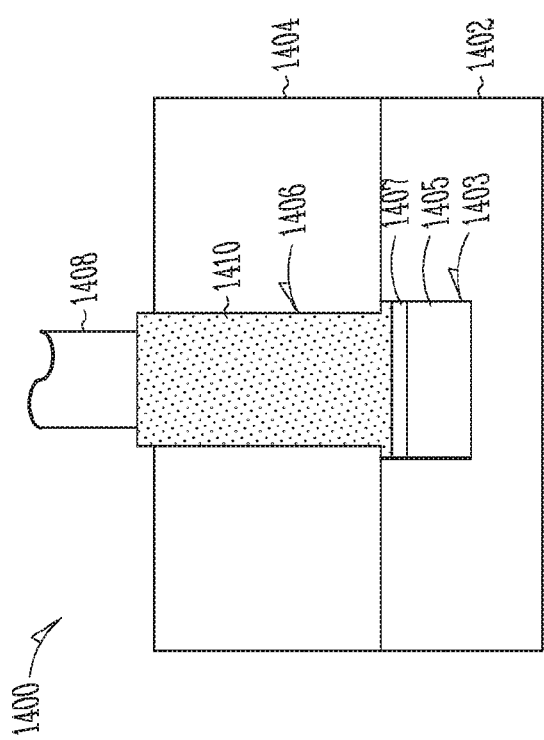
Fig 14B
Fig 14A

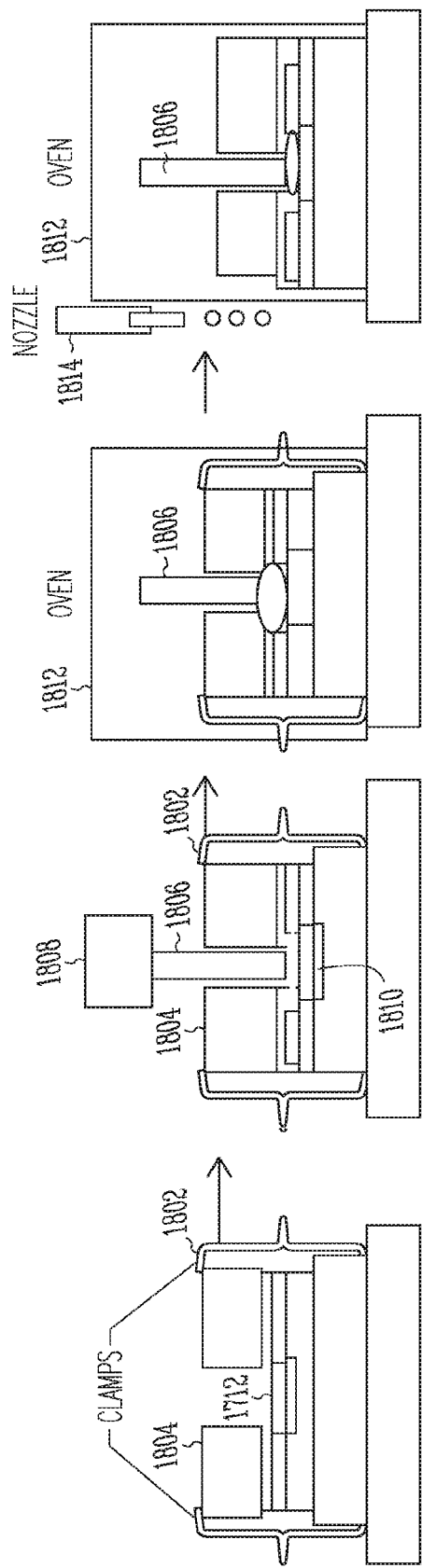

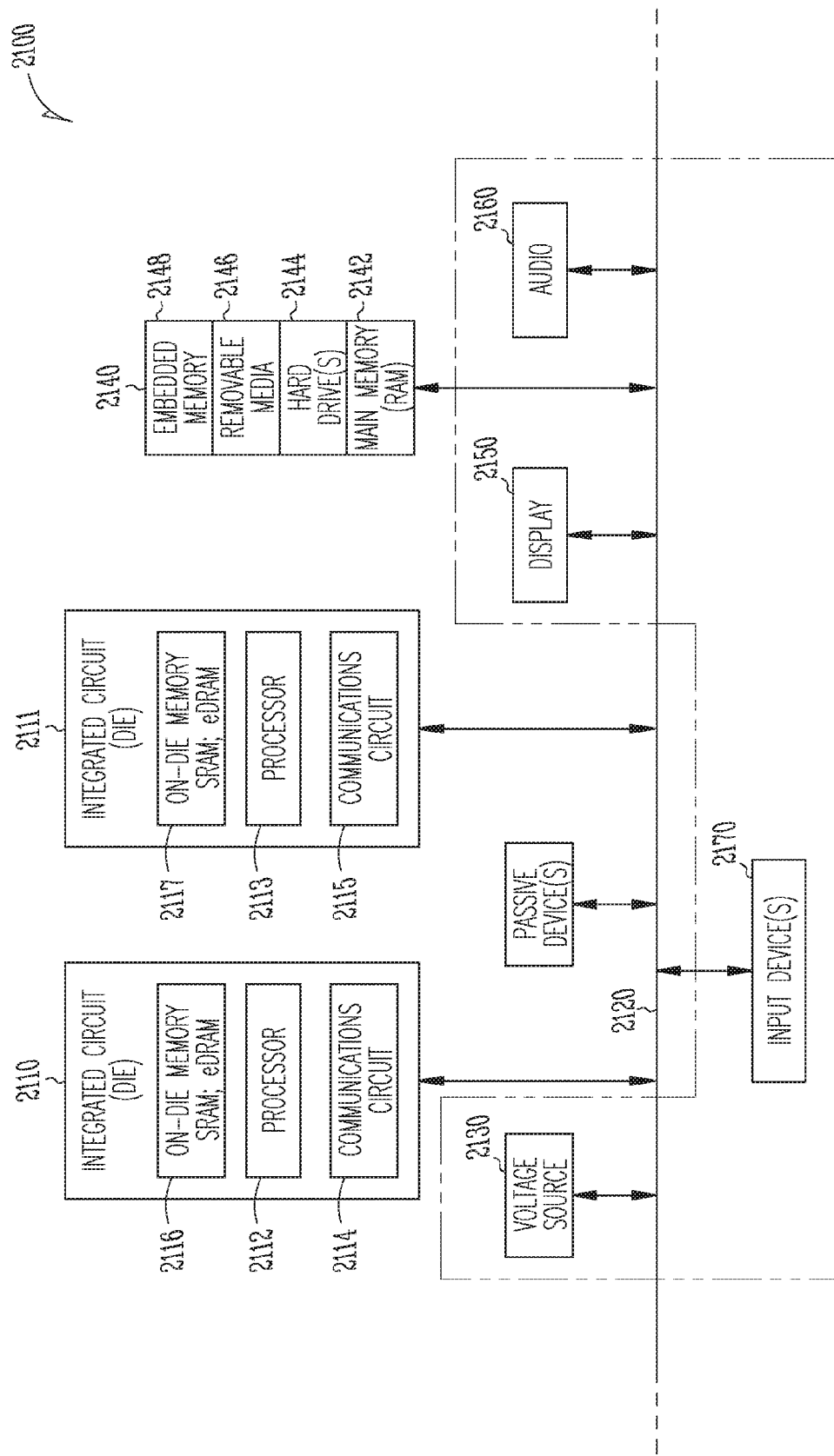

COMPOSITE WIRE PROBE TEST ASSEMBLY

TECHNICAL FIELD

Embodiments relate to the field of integrated circuit manufacturing. In particular, embodiments relate to the field of probes to electrically test integrated circuits.

BACKGROUND

Integrated circuits are commonly electrically tested during integrated circuit manufacturing. During the electrical testing, electrical probes may be used to establish electrical contact between exposed or external electrical contacts of the integrated circuit under test and manufacturing test equipment. Terminal ends of the electrical probes may be contacted with the exposed electrical contacts, and then electrical signals may be exchanged between the manufacturing test equipment and the integrated circuit under test according to a test protocol.

In order to provide good contact, the size of the probes generally depends upon the size and/or the spacing (e.g., the pitch) of the exposed electrical contacts of the integrated circuits. In addition, there is a trend toward ever smaller electrical contacts and ever smaller spacing between the electrical contacts. One challenge is that, as the cross sectional area of the electrical probes decrease, the current carrying capacity of the electrical probes also generally decreases. The current carrying capacity generally represents the amount of current the electrical probes can carry without physical damage. When the cross sections of the electrical probes are too small for the current they are expected to carry, the amount of heat generated by resistance may cause the temperature of the electrical probes to increase to a point that damage occurs (e.g., melting, oxidation or other damaging reaction, etc.).

One approach to attempt to address this problem is to use tungsten, tungsten alloy, or other refractory metal or refractory metal alloy as the material of the electrical probes. These materials generally tend to have relatively high yield strength at high temperatures. However, these materials also generally tend to have relatively low electrical and thermal conductivities, which tend to counteract the benefit of the relatively high yield strength.

Another approach to attempt to address this problem is to form electrical probes as a micro-electro-mechanical system (MEMS) by a lithographic process involving lithographic patterning of a photoresist and development together with chemical and/or physical deposition processes. Stacks of two different materials may be formed alternately one layer over the other in a sandwich-like structure. One of the two materials may have a relatively high yield strength and another of the two materials may have relatively high electrical and thermal conductivities. However, drawbacks to this approach include relatively high manufacturing costs and relatively long assembly lead times, especially for relatively small cross sections.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 11 illustrates an embodiment of a straight electrical probe.

FIG. 12 illustrates a first embodiment of a shaped electrical probe.

FIG. 14A is a cross-section side view of a probe disposed nearby a cavity, with solder yet to be melted, according to an embodiment.

FIG. 14B is a cross-section side view of a probe disposed in a cavity, with solder yet to be melted, according to an embodiment.

FIG. 18A is first step in joining a wire to a trace, according to an embodiment.

FIG. 18B is second step in joining a wire to a trace, according to an embodiment.

FIG. 18C is third step in joining a wire to a trace, according to an embodiment.

FIG. 18D is fourth step in joining a wire to a trace, according to an embodiment.

FIG. 21 is a diagram of a computer system, according to an embodiment.

DETAILED DESCRIPTION

Figure 1:
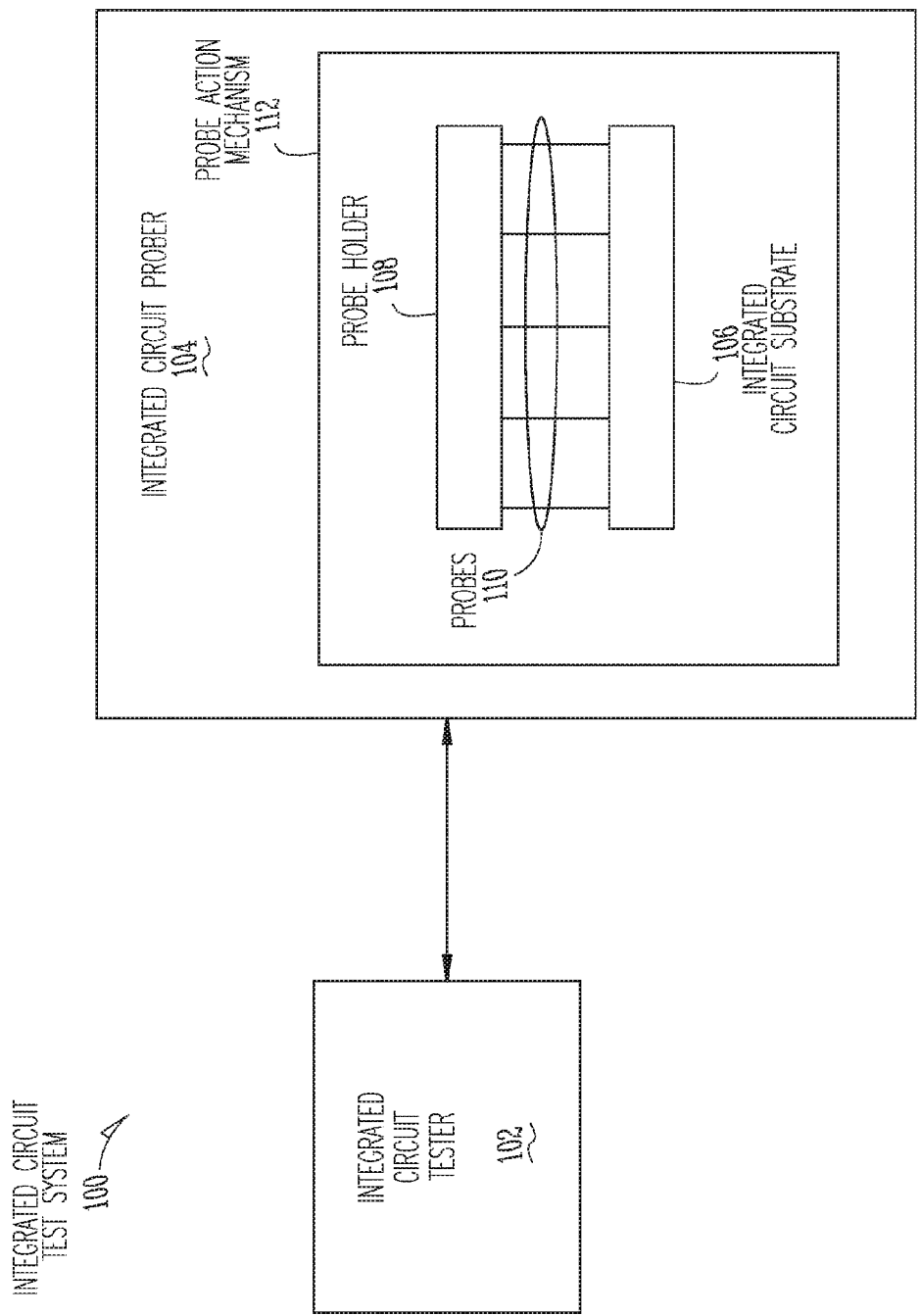
FIG. 1 is a block diagram of an embodiment of an integrated circuit test system.

FIG. 1 is a block diagram of an embodiment of an integrated circuit test system 100. The integrated circuit test system includes an integrated circuit tester 102 and an integrated circuit prober 104. The integrated circuit tester and the integrated circuit prober are coupled, or otherwise in communication with, one another. The integrated circuit tester and the integrated circuit prober may each represent substantially conventional integrated circuit manufacturing machines or equipment and/or integrated circuit testing machines or equipment. The integrated circuit tester and prober may be implemented in hardware together with software, firmware, or a combination of software and firmware.

Deployed in the integrated circuit prober is an integrated circuit substrate 106. By way of example, the integrated circuit substrate may represent a wafer having a plurality of dice or a singulated individual die. The integrated circuit substrate includes exposed or external electrical contacts (e.g., pads, bumps, solder, other exposed conductive structures electrically coupled with interconnects and/or circuitry of the substrate, etc.).

Also deployed in the integrated circuit prober is an embodiment of a probe holder 108 having an embodiment of a plurality of electrical probes 110. The probe holder may be mechanically and electrically docked or otherwise mechanically and electrically coupled with the prober. The probe holder is electrically coupled with the tester. The probe holder generally represents a device to provide a sufficiently sturdy mechanical support structure for the probes that helps to protect the probes and allow the probes to be handled together. Additionally, the probe holder generally represents a device to transform the layout of the electrical contacts into the layout of proper electrical connectors appropriate for the proper. The probe holder may represent a probe card, probe head, probe carrier, or other device to carry, hold, or otherwise provide the plurality of probes. The probe holder is not limited to any known type of design, but rather may have any of various different types of designs known in the arts for probe cards, probe holders, probe heads, other devices to provide probes, etc. The probes may represent any of the various different embodiments of probes described elsewhere herein.

The integrated circuit prober may include a probe action mechanism 112 that is operable to manipulate or move the probe holder and/or the integrated circuit substrate relative to one another so that terminal ends of embodiments of probes contact the exposed electrical contacts of the integrated circuit substrate. Either the probe holder may be moved, or the integrated circuit substrate may be moved, or both the probe holder and the integrated circuit substrate may be moved. By way of example, the mechanism may include a robotic arm to move the probe holder and a vacuum mount chuck to hold and potentially move the integrated circuit substrate. In some cases, the probe action mechanism may include a machine vision system, such as one or more cameras and machine vision software, to align the probes relative to the exposed electrical contacts.

The integrated circuit tester is electrically coupled with the probes and may be operable to test the integrated circuit substrate according to a test protocol. The integrated circuit tester may cause electrical signals to be exchanged with the integrated circuit substrate through the probes. For example, the integrated circuit test system may provide power to the integrated circuit substrate through some of the probes, and exchange electrical signals with the integrated circuit substrate through other of the probes. The electrical signals may be exchanged according to a test protocol or particular test patterns (e.g., in an effort to test for functional defects). Electrical signals received from the integrated circuit substrate may be analyzed as part of the testing. In some embodiments, results of the testing may be stored (e.g., for future use in processing the integrated circuit substrate). Either the whole integrated circuit substrate may be tested at once (e.g., all of the dice) or different portions thereof (e.g., different die thereof) may be tested individually/sequentially.

In some embodiments, testing may be performed during wafer test and sort. During wafer test and sort, a wafer is tested before its dice are separated from one another. The testing of the wafer helps to identify which of the dice are "good" (e.g., sufficiently pass the test) versus which are "bad" (e.g., fail the test). The outcome of the testing may be stored and used for subsequent processing (e.g., to identify the good die to package versus the bad die to discard or re-work. Identifying the bad dice may help to avoid time and costs associated with processing and packaging bad dice. In some cases, wafer test and sort may also be used to categorize the good device based on various levels of speed or performance. In other embodiments, individual separated die may be electrically tested after a wafer has been diced. Electrical testing may also be performed at other points in a manufacturing process and/or for other purposes without limitation on the scope of the invention.

Figure 2:
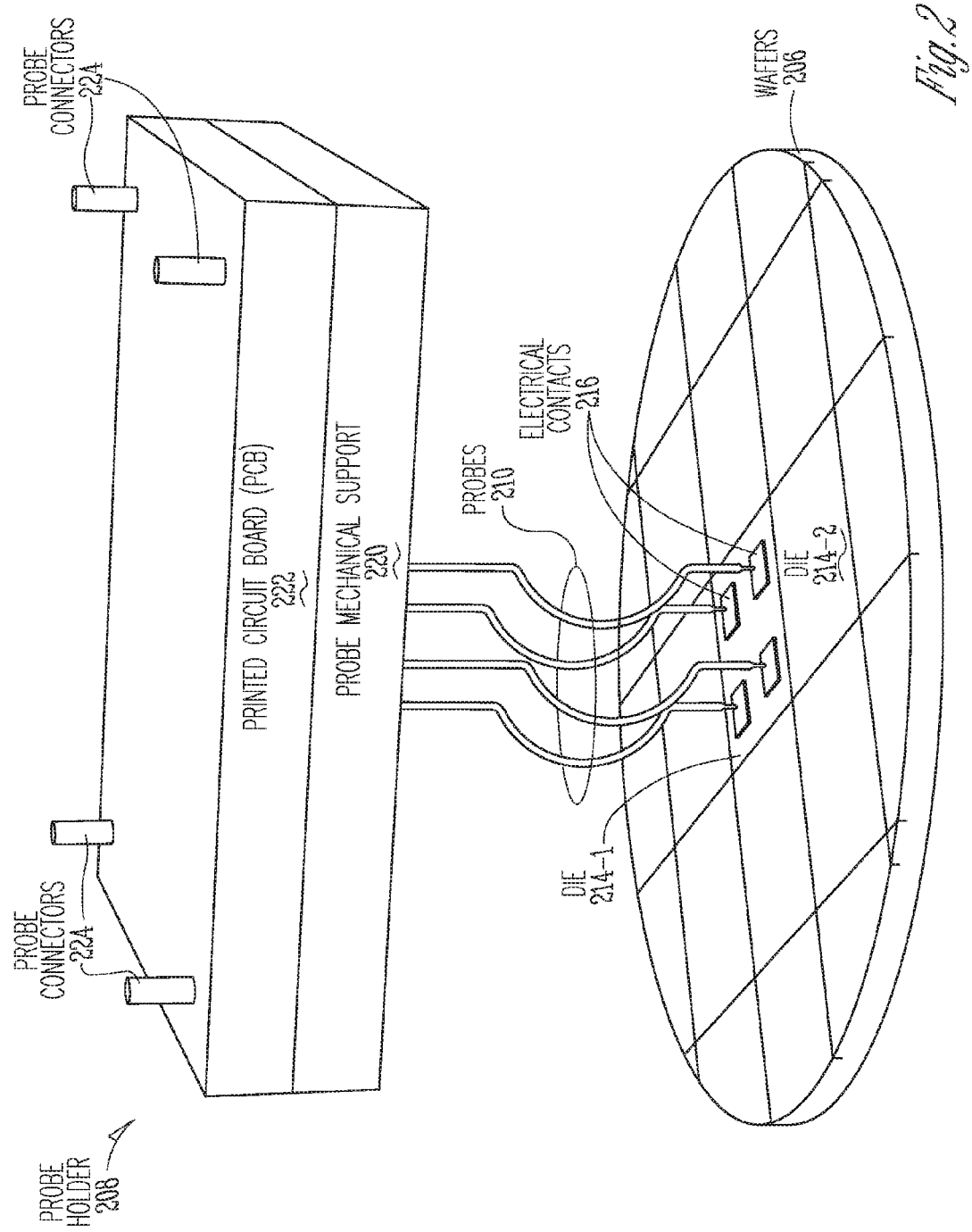
FIG. 2 is a perspective view of an embodiment of a probe holder having an embodiment of a plurality of probes coupled with exposed electrical contacts of a die of a wafer also having another die.

FIG. 2 is a perspective view of an embodiment of a probe holder 208 having an embodiment of a plurality of probes 210 coupled with exposed electrical contacts 216 of a die 214-1 of a wafer 206 also having another die 21-2. The probe holder may represent any of various different types of probe cards or like devices known in the arts. Examples of suitable types of probe holders, but are not limited to, high-density vertical probe cards, epoxy-based probe cards (e.g., epoxy ring probe cards), blade-based probe cards, membrane probe cards, micro-spring probe cards, vertical probe cards, and other probe cards known in the arts.

The wafer generally has the shape of a round thin disc. By way of example, the wafer may range from around two to around twelve inches in diameter, and may have a thickness of around an eighth of an inch or less, although this is not required. The wafer may include semiconductor (e.g., silicon), conductor (e.g., metal), insulating (e.g., dielectric), and various other types of materials conventionally used for wafers. The wafer includes a number of die 214-1, 214-2. For simplicity, in the illustration, the wafer includes only a few dice, although often a wafer may include anywhere from tens to hundreds of dice. Each die may include integrated circuitry (e.g., transistors, resistors, capacitors, interconnect, etc.) that is embedded or formed within the materials of the wafer.

The outside surface of the wafer and/or each die may include a number of exposed or external electrical contacts 216. For simplicity, in the illustration only four are shown, although anywhere from tens to many hundreds may be included for a probe holder. The electrical contacts broadly represent conductive structures that are accessible from the outside of the wafer and that are electrically coupled with interconnects of the wafer. Examples of suitable types of electrical contacts include, but are not limited to, pads (e.g., bond pads), bumps, solder, or other conductive structures or materials electrically coupled with interconnects of the wafer.

Different configurations of the electrical contacts are suitable for the probe holder. The scope of the invention is not limited to any particular configuration. To further illustrate certain concepts, two common configurations will be briefly described, although the scope of the invention is not limited to any particular configuration.

Figure 3:
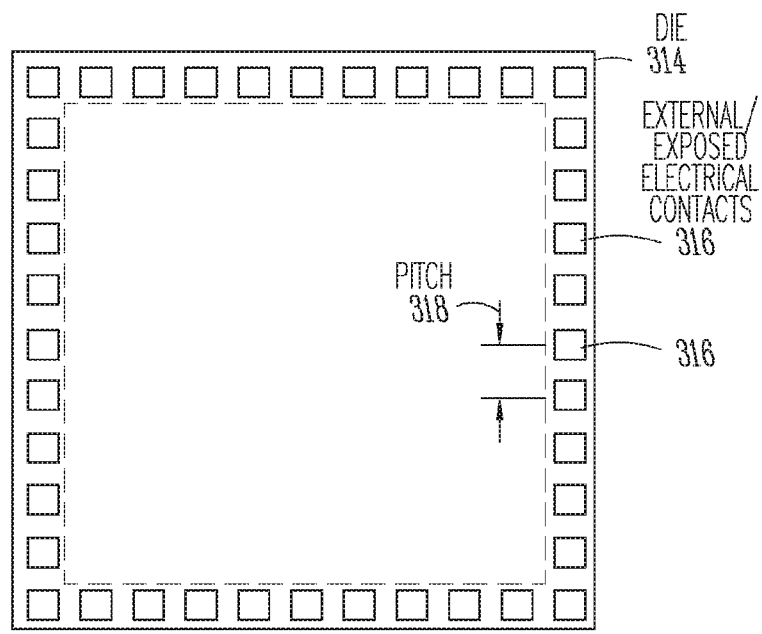
FIG. 3 is a top planar view of a first suitable configuration of electrical contacts for a die, according to an embodiment.

FIG. 3 is a top planar view of a first suitable configuration of electrical contacts 316 for a die 314. In this configuration, the electrical contacts (e.g., bond pads) are located along a periphery or perimeter of the die. The electrical contacts have spacing or pitch 318. An active region of the die is included generally within this periphery. Moreover, in this configuration, the electrical contacts are disposed on the top side of the die, which is the same side of the die where the integrated circuitry of the active region is formed. To package the die, individual bond wires may be used to electrically couple the electrical contacts to corresponding electrical contacts of a package substrate.

Figure 4:
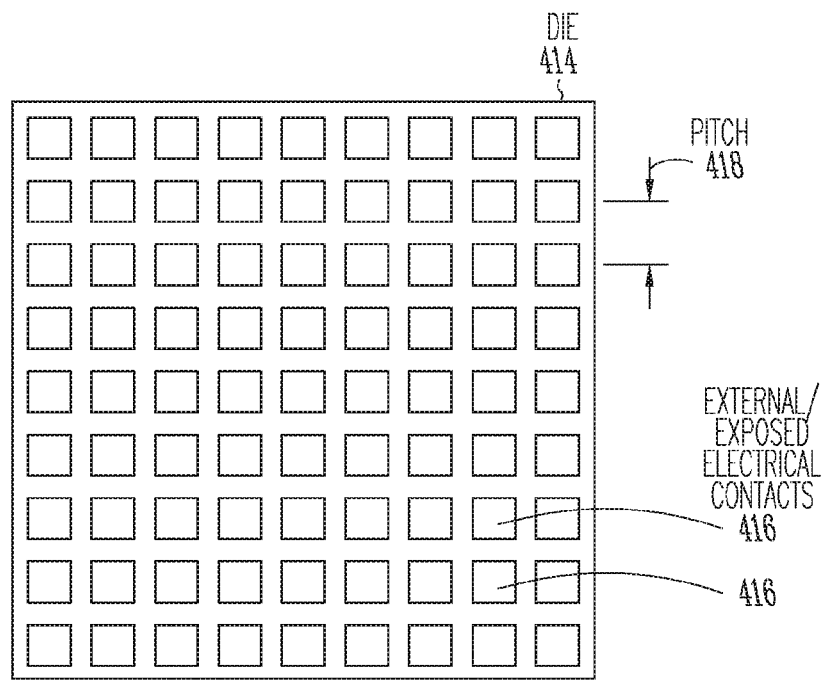
FIG. 4 is a top planar view of a second suitable configuration of electrical contacts for a die, according to an embodiment.

FIG. 4 is a top planar view of a second suitable configuration of electrical contacts 416 for a die 414. In this configuration, the electrical contacts (e.g., bond pads) are disposed across the entire surface of the die instead of only along the periphery, which allows more electrical contacts to be placed across the surface of the die. The electrical contacts have spacing or pitch 418. In this configuration, the electrical contacts are disposed on the bottom side of the die and active integrated circuitry is formed in an active region of the top side of the die. The electrical contacts are directly over the integrated circuitry in the active region. To package the die, solder balls may be included on each of the electrical contacts to electrically couple them to corresponding electrical contacts on a package substrate. The die may be mounted on the package substrate in a "flipped" orientation using flip-chip or Controlled Collapse Chip Connection (C4) technology.

Referring again to FIG. 2, the probe holder includes the plurality of probes 210. For simplicity, in the illustration only four probes are shown, although there may be anywhere from tens to thousands of probes. Any of the various embodiments of probes disclosed elsewhere herein are suitable. Each of the probes is fixedly physically and electrically coupled with the probe holder, and removably physically and electrically coupled with a different one of the electrical contacts. Each of the probes has a first terminal end (closest to the probe holder) that is fixedly adhered or otherwise fixedly coupled with a probe mechanical support 220 of the probe holder. Each of the probes also has a second free terminal end (closest to the wafer) that during use is in removable physical and electrical contact or coupling with a corresponding electrical contact.

The probe mechanical support generally represents a sufficiently mechanically sturdy structure or material to mechanically group and protect the probes. Examples of suitable types of probe mechanical supports include, but are not limited to, rings, blades, and other types of supports known in the arts. The probe mechanical support is also commonly formed of an electrically insulating material (e.g., ceramic, fiberglass, plastic, etc.), although other materials such as metals may optionally be used. The probe mechanical support may have square, rectangular, circular, ring, irregular, or other shapes. The probes may be adhered to the probe mechanical support with an epoxy, adhesive, or may be otherwise physically coupled with the mechanical support.

The probe mechanical support is physically coupled with a printed circuit board (PCB) 222. The first terminal ends of the probes (closest to the probe holder) are soldered or otherwise electrically coupled with metal traces or other circuitry of the PCB. The PCB represents the electrical interface between the probes and the prober. The circuitry of the PCB routes electrical signals from the probes to prober electrical connectors 224 arranged in a way appropriate for the proper. Examples of suitable types of proper electrical connectors include, but are not limited to, terminal pins (T-pins), pogo pads, edge connectors, and the like, and combinations thereof. The probes may be arranged in a way specific to, or at least based on, the layout of the electrical contacts on the integrated circuit. However, the prober may have a different layout and the probe holder may transform or route (e.g., through the circuitry of the PCB) the layout appropriate for the integrated circuit to the layout appropriate for the prober. The printed circuit board may also include circuit elements such as resistors, capacitors, inductors, or the like, to manipulate or control the electrical signals in various ways.

In some embodiments, each of the probes may be shaped to provide a flexing or springing action. As used herein, a shaped probe is broadly interpreted as not merely a straight probe, but rather one that includes one or more of a curve, a bend, a twist, a coil, or a combination thereof. The shaped probes may be used to provide a spring-like or flexing action when contacting the electrical contacts. When a terminal end of a probe contacts an electrical contact, the probe may begin to flex or spring-engage, which may help to reduce the amount of puncturing or damage to the electrical contacts and/or damage to the probes. Such a spring-like or flexing action may also help accommodate for differences in length of the probe wires and/or the heights of the electrical contacts (e.g., certain probes may contact their corresponding electrical contacts before other probes contact their corresponding electrical contacts). Also, during the contact in some cases a so-called scrubbing action and/or a certain amount of spring-like force may potentially be provided to scrub or break through a surface layer (e.g., a surface oxide) of the electrical contacts in order to improve electrical contact. Some shaped probes may provide for overtravel or lateral movement of the probe along the electrical contact after initial touchdown of the probe on the electrical contact. Such overtravel helps to provide the aforementioned scrubbing action.

In the particular illustrated embodiment, each of the shaped probes has a first straight segment coupled with the probe holder, a second straight segment coupled with an electrical contact, and a curved or arched central segment between the straight segments. The curved or arched central segment provides the spring-like or flexing action. This particular shape is not required. Other suitable embodiments of shaped probes will be discussed further below. Moreover, still other embodiments pertain to straight probes.

As previously discussed in the background section, the size of an electrical probe generally depends upon the size and/or the spacing (e.g., the pitch) of the exposed electrical contacts of the integrated circuits to be tested. In addition, there is a trend toward ever smaller electrical contacts and ever smaller spacing between the electrical contacts. One challenge is that, as the cross sectional area of the electrical probes decrease, the current carrying capacity of the electrical probes also generally decreases. The current carrying capacity generally represents the amount of current the electrical probes can carry without physical damage. When the cross sections of the electrical probes are too small for the current they are expected to carry, the amount of heat generated by resistance may cause the temperature of the electrical probes to increase to a point that damage occurs (e.g., melting, oxidation or other damaging reaction, etc.).

Figure 5:
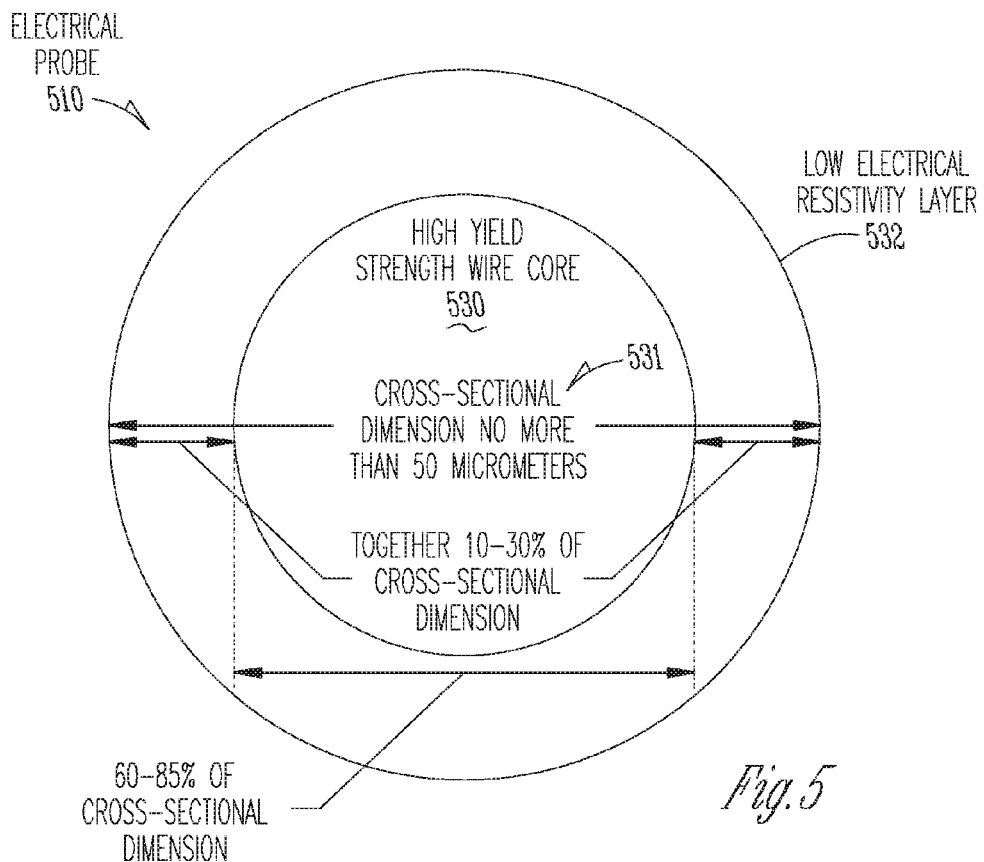
FIG. 5 is a cross-sectional view of an embodiment of an electrical probe.

FIG. 5 is a cross-sectional view of an embodiment of an electrical probe 510. As shown, in some embodiments, the electrical probe may have an outer diameter or other cross-sectional dimension 531 that is no more than about 50 µm. In some embodiments, the cross-sectional dimension may be no more than about 25 µm. As shown, in some embodiments, the electrical probe may have a substantially round cross section. For example, the substantially round cross section may be circular or elliptical. Alternatively, the round cross section may be approximated by a pentagonal, hexagonal, octagonal, or other polygonal cross section. It is to be appreciated that when manufacturing probes of such sizes that perfect circularity is difficult to achieve and that these terms are intended to encompass such imperfect circularities. The electrical probe generally will have an elongated wire-like structure often having a length (into the page in the illustration) that ranges from about 500 µm to many thousands of micrometers, or even longer.

The electrical probe includes a high yield strength wire core 530. The yield strength of a material may represent the stress at which the material begins to deform plastically. Prior to the yield strength the material may deform elastically and may return to substantially its original shape when the applied stress is removed. After then yield strength has been passed some of the deformation may remain after the stress is removed and be non-reversible. In some embodiments, the high yield strength wire core may have a high yield strength that is at least 1 gigapascal (GPa) at a temperature of 250° C. In large scale manufacturing, integrated circuit test probes are often expected to be capable of engaging and un-engaging (e.g., flexing and un-flexing) numerous times (e.g., potentially thousands to millions) without becoming significantly permanently deformed to be no longer practically useful. In some embodiments, the high yield strength wire core provides between about 60% to about 85%, or in some cases between about 65% to about 80%, of the outer cross-sectional dimension. In some embodiments, the high yield strength wire core includes predominantly one or more of the metals or materials tungsten, a tungsten-copper alloy, a tungsten-nickel alloy, a beryllium-copper alloy, molybdenum, stainless steel, and combinations thereof. In this description, the term metal may be used to refer to either a substantially pure single metallic element or an alloy, mixture, or other combination of two or more different elements in which at least one is a metallic element. In this description, the term alloy may include metal elements as well as non-metal elements. In this description, stainless steel refers to an iron alloy including between about 8 wt % to about 35 wt % chromium. In some aspects, the high yield strength wire core may include a homogeneous core including a single one of these materials. For example, in one particular embodiment, the homogeneous core may comprise predominantly or in some cases consist essentially of one of tungsten, a tungsten-copper alloy, or a tungsten-nickel alloy. Alternatively, in other aspects, the high yield strength wire core may be a composite core including an inner core having one of these materials and at least one concentric core layer having a different one of these materials. In some embodiments, the high yield strength wire core or the inner core thereof may be formed by drawing the aforementioned material through a die. The fact that the wire core was drawn through a die may be indicated by die marks or die lines caused by imperfections in the die being present on the wire core.

The electrical probe also includes a low electrical resistivity layer 532. The low electrical resistivity layer is concentrically disposed around the high yield strength wire core. The low electrical resistivity layer has an electrical resistivity of no more than $2 \times 10^{-8}$ Ohm-meters ($\Omega$-m) at room temperature which is approximately the electrical resistivity of copper. In some embodiments, the low electrical resistivity layer may provide between about 10% to about 30%, or in some cases between about 15% to about 25%, of the outer cross-sectional dimension. If desired, in other embodiments, the amount of the low electrical resistivity layer may be even less, for example between about 5% to about 15%, with the amount being made up of other materials (e.g., those of the high yield strength wire core), although this may tend to reduce the electrical conductivity of the electrical probe. In some embodiments, the low electrical resistivity layer includes predominantly one or more of silver, gold, copper, and combinations thereof. In some aspects, the low electrical resistivity layer may include a homogeneous layer including a single one of these materials. For example, in one particular embodiment, the homogeneous layer may consist essentially of silver. Alternatively, in other aspects, the low electrical resistivity layer may be a composite or laminate including two or more concentric layers each including a different one of these materials. In some embodiments, the low electrical resistivity layer(s) may be formed by plating (e.g., electroplating) a metal on the high yield strength wire core.

In some embodiments, the electrical probe may have an electrical resistivity of no more than $3 \times 10^{-8}$ $\Omega$-m at room temperature. In some embodiments, the electrical probe may have a yield strength of at least 500 megapascal (MPa).

Advantageously, the electrical probe includes a mechanical core operable to provide good high temperature mechanical properties together with a concentric layer around the mechanical core to provide low electrical and thermal resistivity properties. Different materials may be used for the core and the concentric layer rather than attempting to find one alloy that meets both of these goals. Desired current carrying capacities as well as desired mechanical properties may be achieved even when the diameters or cross-sectional dimensions of the electrical probes are no more than about 50 micrometers (µm), or in some cases no more than about 25 µm. Moreover, the electrical probes may be manufactured by drawing the core through a die and plating one or more layers on the core, without needing to rely on a lithographic-based process, which tends to be costly.

Figure 6:
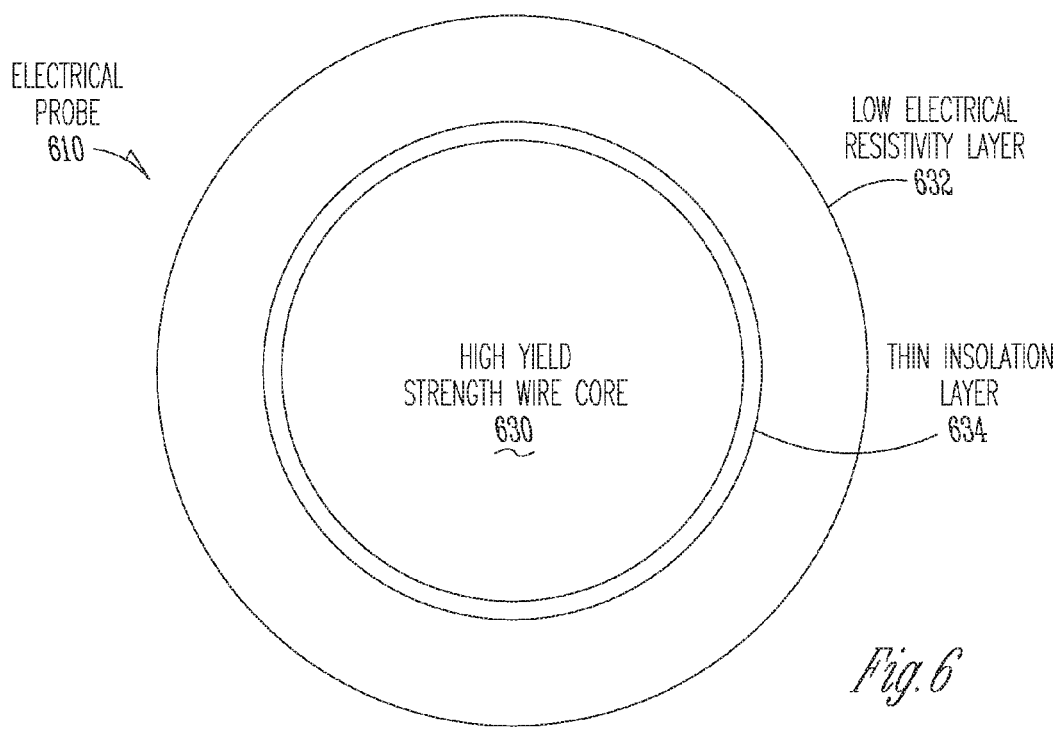
FIG. 6 is a cross-sectional view of an embodiment of an electrical probe including an optional thin isolation layer concentrically disposed between a high yield strength wire core and a low electrical resistivity layer.

FIG. 6 is a cross-sectional view of an embodiment of an electrical probe 610 including an optional thin isolation layer 634 concentrically disposed between a high yield strength wire core 630 and a low electrical resistivity layer 632. In some embodiments, the thin isolation layer may have a thickness ranging between about 0.1 to about 0.6 µm, or in some cases between about 0.3 to about 0.6 µm. Thicknesses greater than 0.6 µm may also optionally be used but tend to begin to more significantly affect the mechanical properties of the electrical probe (e.g., how it flexes). In some embodiments, the thin isolation layer may include predominantly one or more of nickel, cobalt, and a combination thereof. In one particular embodiment, the thin isolation layer may include a 0.3 to 0.6 µm layer of nickel, although this is not required. The thin isolation layer may be operable to prevent, or at least reduce, contact between the materials of the high yield strength wire core and the low electrical resistivity layer. Without the thin isolation layer, the materials of the high yield strength wire core and the low electrical resistivity layer at the interface may tend to inter-diffuse or inter-mix and may potentially react to form intermetallic compounds. Such intermetallic compounds often tend to have undesirable properties (e.g., be brittle). The inclusion of the thin isolation layer may help to reduce the inter-mixing of these materials and/or the formation of intermetallic compounds. In some embodiments, the thin isolation layer may be formed by plating (e.g., electroplating) a metal on the high yield strength wire core, and then the low electrical resistivity layer may be formed by plating (e.g., electroplating) the low electrical resistivity layer on the thin isolation layer. The high yield strength wire core and the low electrical resistivity layer may be described in conjunction with FIG. 5.

Figure 7:
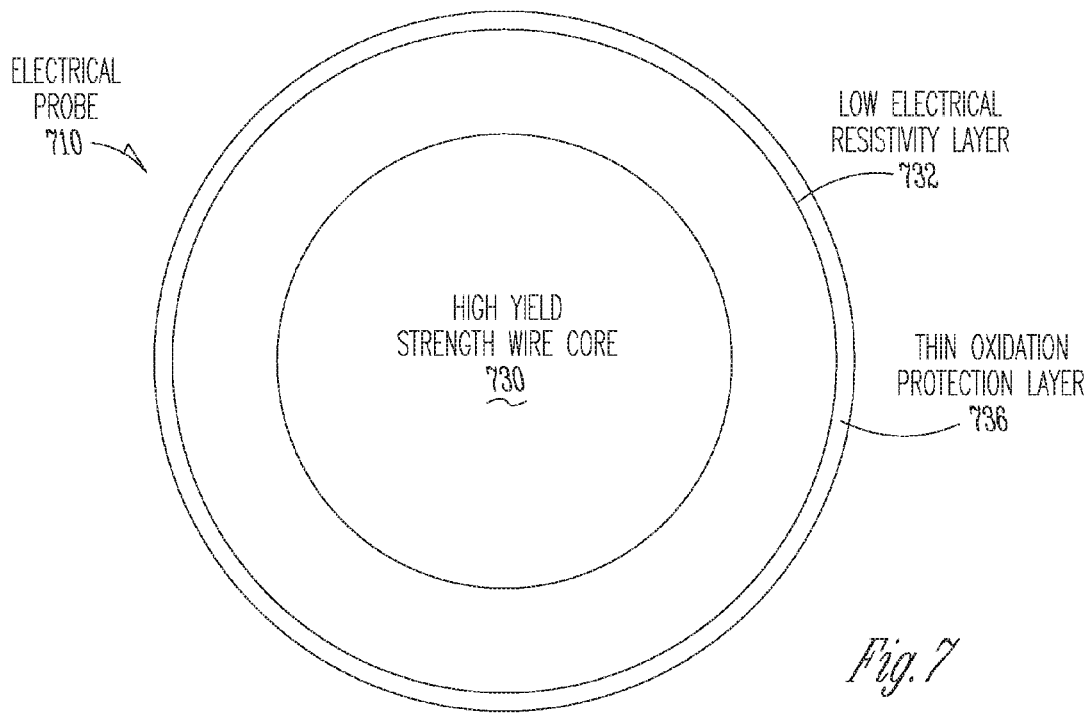
FIG. 7 is a cross-sectional view of an embodiment of an electrical probe including a high yield strength wire core, a low electrical resistivity layer, and an optional thin oxidation protection layer concentrically disposed around the low electrical resistivity layer.

FIG. 7 is a cross-sectional view of an embodiment of an electrical probe 710 including a high yield strength wire core 730, a low electrical resistivity layer 732, and an optional thin oxidation protection layer 736 concentrically disposed around the low electrical resistivity layer. The thin oxidation protection layer provides an outside surface of the electrical probe. In some embodiments, the thin oxidation protection layer may have a thickness ranging between about 0.1 to about 0.6 µm, or in some cases between about 0.3 to about 0.6 µm. In some embodiments, the thin oxidation protection layer may include predominantly one or more of gold, platinum, ruthenium, rhodium, palladium, osmium, iridium, chromium, and combinations thereof. Gold, platinum, ruthenium, rhodium, palladium, osmium, and iridium represent noble metals. In one particular embodiment, the thin oxidation protection layer may include a 0.3 to 0.6 µm layer of gold, although this is not required. The thin oxidation protection layer may be operable to prevent, or at least reduce, oxidation of the underlying low electrical resistivity layer. Without the thin oxidation protection layer, the material of the low electrical resistivity layer may potentially oxidize or react with the environment. In some embodiments, the thin oxidation protection layer may be formed by plating (e.g., electroplating) a metal on the low electrical resistivity layer. The high yield strength wire core and the low electrical resistivity layer may be described in conjunction with FIG. 5.

Figure 8:
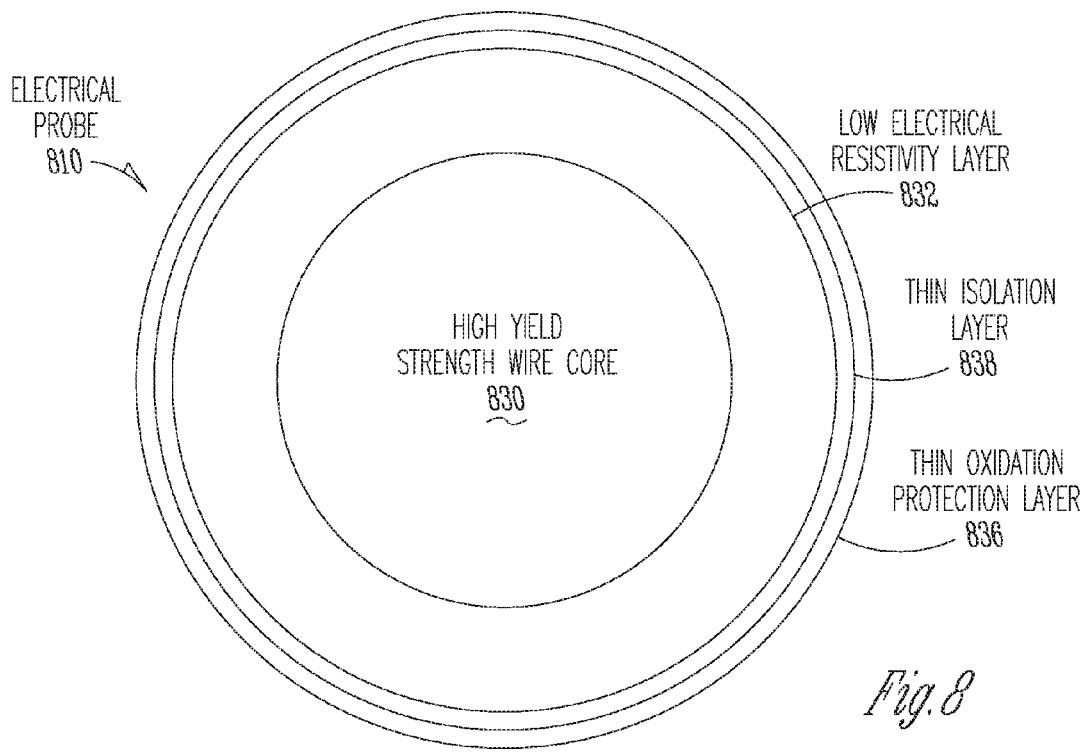
FIG. 8 is a cross-sectional view of an embodiment of an electrical probe including a high yield strength wire core, a low electrical resistivity layer, an optional thin oxidation protection layer concentrically disposed over the low electrical resistivity layer, and an optional thin isolation layer concentrically disposed between the low electrical resistivity layer and the optional thin oxidation protection layer.

FIG. 8 is a cross-sectional view of an embodiment of an electrical probe 810 including a high yield strength wire core 830, a low electrical resistivity layer 832, an optional thin oxidation protection layer 836 concentrically disposed over the low electrical resistivity layer, and an optional thin isolation layer 838 concentrically disposed between the low electrical resistivity layer and the optional thin oxidation protection layer. In some embodiments, the thin isolation layer may have a thickness ranging between about 0.1 to about 0.6 µm, or in some cases between about 0.3 to about 0.6 µm. In some embodiments, the thin isolation layer may include predominantly one or more of nickel, cobalt, and a combination thereof. In one particular embodiment, the thin isolation layer may include a 0.3 to 0.6 µm layer of nickel, although this is not required. The thin isolation layer may be operable to prevent, or at least reduce, contact and intermixing of the materials of the low electrical resistivity layer and the optional thin oxidation protection layer and/or the formation of intermetallic compounds. If the thin oxidation protection layer is omitted then the thin isolation layer may also optionally be omitted. In some embodiments, the thin isolation layer may be formed by plating (e.g., electroplating) a metal on the low electrical resistivity layer, and then the thin oxidation protection layer may be formed by plating (e.g., electroplating) on the thin isolation layer. The high yield strength wire core and the low electrical resistivity layer may be described in conjunction with FIG. 5. In another embodiment, the electrical probe may also optionally include the thin isolation layer 634 of FIG. 6.

Figure 9:
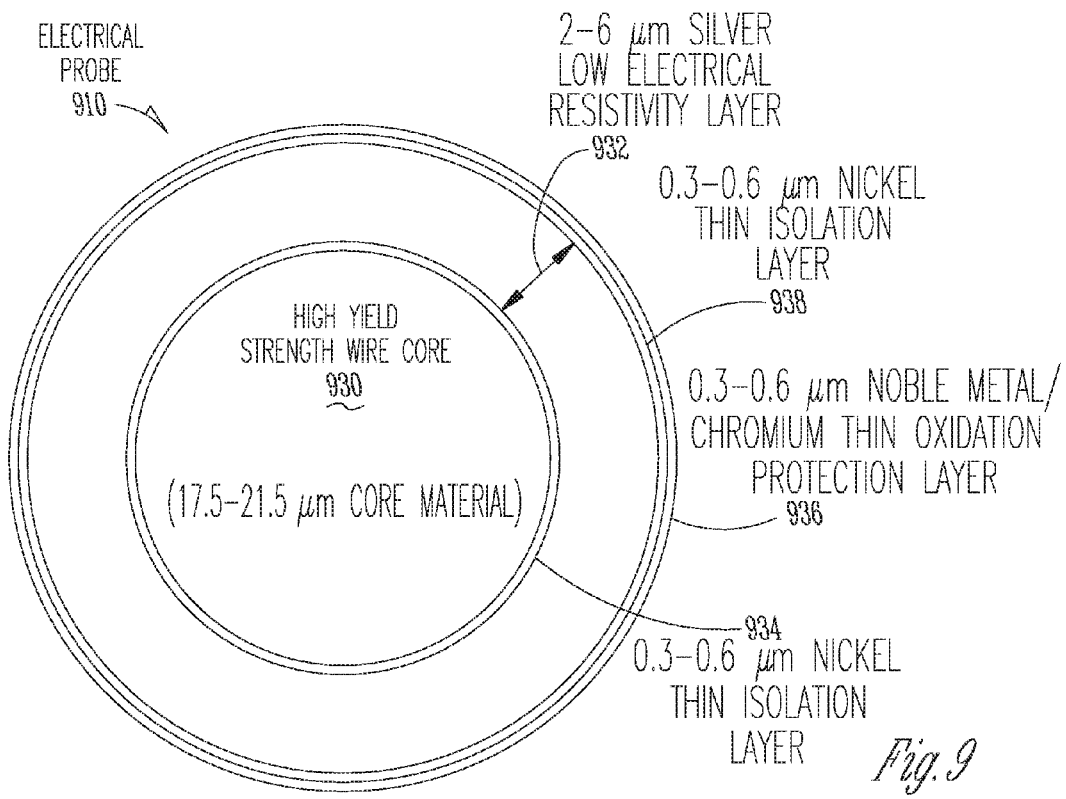
FIG. 9 is a cross-sectional view of a first detailed embodiment of an electrical probe useful for testing electrical contacts having a pitch of about 90 µm.

FIG. 9 is a cross-sectional view of a first detailed embodiment of an electrical probe 910 useful for testing electrical contacts having a pitch of about 90 µm. In the illustrated embodiment, the outer diameter of the electrical probe is 50 µm and the dimensions are consistent with a 50 µm outer diameter. In other embodiments the outer diameter may range between about 43 to about 50 µm, and the other dimensions may be scaled in accordance with the outer diameter. The electrical probe includes a high yield strength wire core 930.

The high yield strength wire core has a radius that ranges between about 17.5 to about 21.5 µm. The high yield strength wire core includes a core material that is one or more of tungsten, tungsten-copper alloy, tungsten-nickel alloy, beryllium-copper alloy, molybdenum, stainless steel, and combinations thereof. In some embodiments, the high yield strength wire core includes one or more of tungsten, tungsten-copper alloy, tungsten-nickel alloy, or combinations thereof. A first thin isolation layer 934 is disposed concentrically over the high yield strength wire core. The first thin isolation layer 934 has a thickness that ranges between about 0.3 to about 0.6 µm. The first thin isolation layer 934 includes predominantly nickel, or in some cases consists of nickel. A low electrical resistivity layer 932 is disposed over the first thin isolation layer 934. The low electrical resistivity layer has a thickness that ranges between about 2 to about 6 µm. The low electrical resistivity layer includes predominantly silver, or in some cases consists of silver. A second thin isolation layer 938 is disposed concentrically over the low electrical resistivity layer. The second thin isolation layer 938 has a thickness that ranges between about 0.3 to about 0.6 µm. The second thin isolation layer 938 includes predominantly nickel, or in some cases consists of nickel. A thin oxidation protection layer 936 is disposed concentrically over the second thin isolation layer 938. The thin oxidation protection layer has a thickness that ranges between about 0.3 to about 0.6 µm. The thin oxidation protection layer includes one or more of a noble metal, chromium, or combinations thereof.

Figure 10:
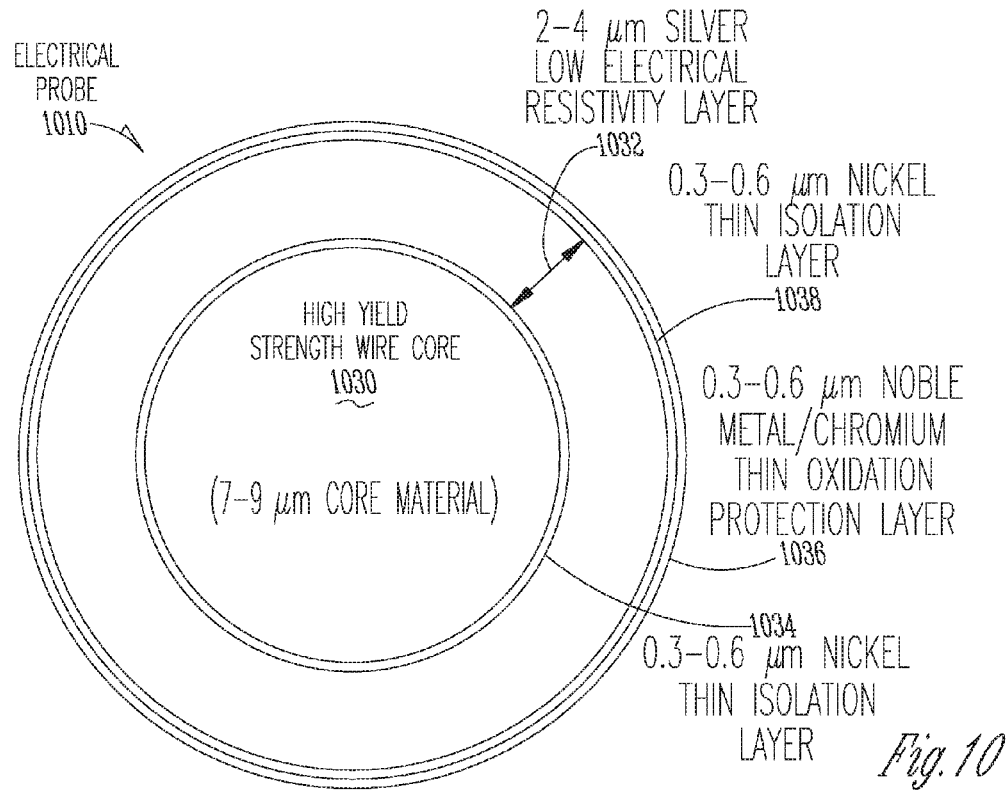
FIG. 10 is a cross-sectional view of a first detailed embodiment of an electrical probe useful for testing electrical contacts having a pitch of about 45 µm.

FIG. 10 is a cross-sectional view of a first detailed embodiment of an electrical probe 1010 useful for testing electrical contacts having a pitch of about 45 µm. In the illustrated embodiment, the outer diameter of the electrical probe is 50 µm and the dimensions are consistent with a 45 µm outer diameter. In other embodiments the outer diameter may range between about 40 to about 45 µm, and the other dimensions may be scaled in accordance with the outer diameter. The electrical probe includes a high yield strength wire core 1030. The high yield strength wire core has a radius that ranges between about 7 to about 9 µm. The high yield strength wire core includes a core material that is one or more of tungsten, tungsten-copper alloy, tungsten-nickel alloy, beryllium-copper alloy, molybdenum, stainless steel, and combinations thereof. In some embodiments, the high yield strength wire core includes one or more of tungsten, tungsten-copper alloy, tungsten-nickel alloy, or combinations thereof. A first thin isolation layer 1034 is disposed concentrically over the high yield strength wire core. The first thin isolation layer 1034 has a thickness that ranges between about 0.3 to about 0.6 µm. The first thin isolation layer 1034 includes predominantly nickel, or in some cases consists of nickel. A low electrical resistivity layer 1032 is disposed over the first thin isolation layer 1034. The low electrical resistivity layer has a thickness that ranges between about 2 to about 4 µm. The low electrical resistivity layer includes predominantly silver, or in some cases consists of silver. A second thin isolation layer 1038 is disposed concentrically over the low electrical resistivity layer. The second thin isolation layer 1038 has a thickness that ranges between about 0.3 to about 0.6 µm. The second thin isolation layer 1038 includes predominantly nickel, or in some cases consists of nickel. A thin oxidation protection layer 1036 is disposed concentrically over the second thin isolation layer 1038. The thin oxidation protection layer has a thickness that ranges between about 0.3 to about 0.6 µm. The thin oxidation protection layer includes one or more of a noble metal, chromium, or combinations thereof.

Advantageously, the electrical probes of FIGS. 9-10 may achieve electrical and thermal resistivity values that are approximately those of gold. This is due in part to the use of silver, which has lower electrical and thermal resistivity values. In some embodiments, for the electrical probe of FIG. 9, the overall or effective electrical resistivity value may range between about $2.7 \times 10^{-8}$ to about $3.1 \times 10^{-8}$ Ω-m, and the overall or effective thermal resistivity value may range between about 260 to about 280 W/m-K. In some embodiments, for the electrical probe of FIG. 10, the overall or effective electrical resistivity value may range between about $2.4 \times 10^{-8}$ to about $2.7 \times 10^{-8}$ Ω-m, and the overall or effective thermal resistivity value may range between about 290 to about 310 W/m-K. Moreover, these electrical and thermal resistivity values are obtained while retaining the high temperature mechanical strength and mechanical properties of the material of the wire core (e.g., those of tungsten, etc.). Rather than needing to select a single material or alloy to provide all of the desired electrical and thermal resistivity values as well as the mechanical strength and other mechanical properties, different materials may be used in the core and in one or more concentric layers to provide the desired properties.

In FIGS. 9-10, in some embodiments, the high yield strength wire core may represent a drawn wire that has been drawn through a wire forming die. Moreover, in some embodiments, each of the low electrical resistivity layer, the first thin isolation layer, the second thin isolation layer, and the thin oxidation protection layer may represent plated (e.g., electroplated) layers. Advantageously, such a method of manufacture, by drawing a wire core through a die and plating one or more layers on the wire core), may render the electrical probes relatively economical to manufacture especially relative to electrical probes formed by a lithographic process as mentioned in the background section of this application.

FIG. 11 illustrates an embodiment of a straight electrical probe 1110. The straight electrical probe has a length of at least about 500 μm up to many thousands of micrometers, or even longer. The straight electrical probe has a round or substantially circular cross section with a diameter or other cross-sectional dimension that in some embodiments is no more than 50 μm, and in other embodiments is no more than 25 μm. A terminal end of the straight electrical probe intended to contact electrical contacts is tapered along a taper length. In some embodiments, the taper length may be on the order of tens to several hundred micrometers. In the illustration, the terminal end is tapered to a sharp point, although in other embodiments the terminal end may be tapered to a lesser diameter but not a sharp point. In some cases, etching may be used to taper the end and the terminal point may be sanded back to the desired diameter. Other aspects of the straight electrical probe may be as described elsewhere herein.

FIG. 12 illustrates a first embodiment of a shaped electrical probe 1210. The shaped electrical probe has a length of at least about 500 μm up to many thousands of micrometers, or even longer. The shaped electrical probe has a round or substantially circular cross section with a diameter or other cross-sectional dimension that in some embodiments is no more than 50 μm, and in other embodiments is no more than 25 μm. This embodiment of the shaped electrical probe has a single bend near the terminal end intended to contact electrical contacts (e.g., within from tens to several hundred micrometers from the terminal end). The shaped electrical probe includes a first straight segment between the terminal end intended to contact electrical contacts and the bend that has a tip length, a second straight segment between the other terminal end of the electrical probe and the bend, and a bend between the first and second straight segments. In some embodiments, the first straight segment may be significantly shorter than the second straight segment. The bend may have an internal bend angle. The magnitude of the internal bend angle affects the "scrubbing" action of the probe on the contact pad. Too large a bend angle may tend to cause the probe to slide off the electrical contact without proper scrubbing of a surface oxide, whereas too narrow a bend angle may tend to cause the probe to press too hard on the contact and potentially cause damage. In some embodiments, the internal bend angle may range between about 98° to about 108°, in some cases between about 100° to about 106°. A terminal end of the shaped electrical probe intended to contact electrical contacts is tapered along a taper length. In some embodiments, the taper length may be on the order of tens to several hundred micrometers. In the illustration, the terminal end is tapered to a reduced tip diameter or other cross-sectional dimension, although in other embodiments the terminal end may be tapered to a sharp point. In some cases, etching may be used to taper the end and the terminal point may be sanded, grinded, or otherwise modified back to the desired tip diameter. The taper may begin before or after the bend starts. Other aspects of the shaped electrical probe may be as described elsewhere herein.

Figure 13:
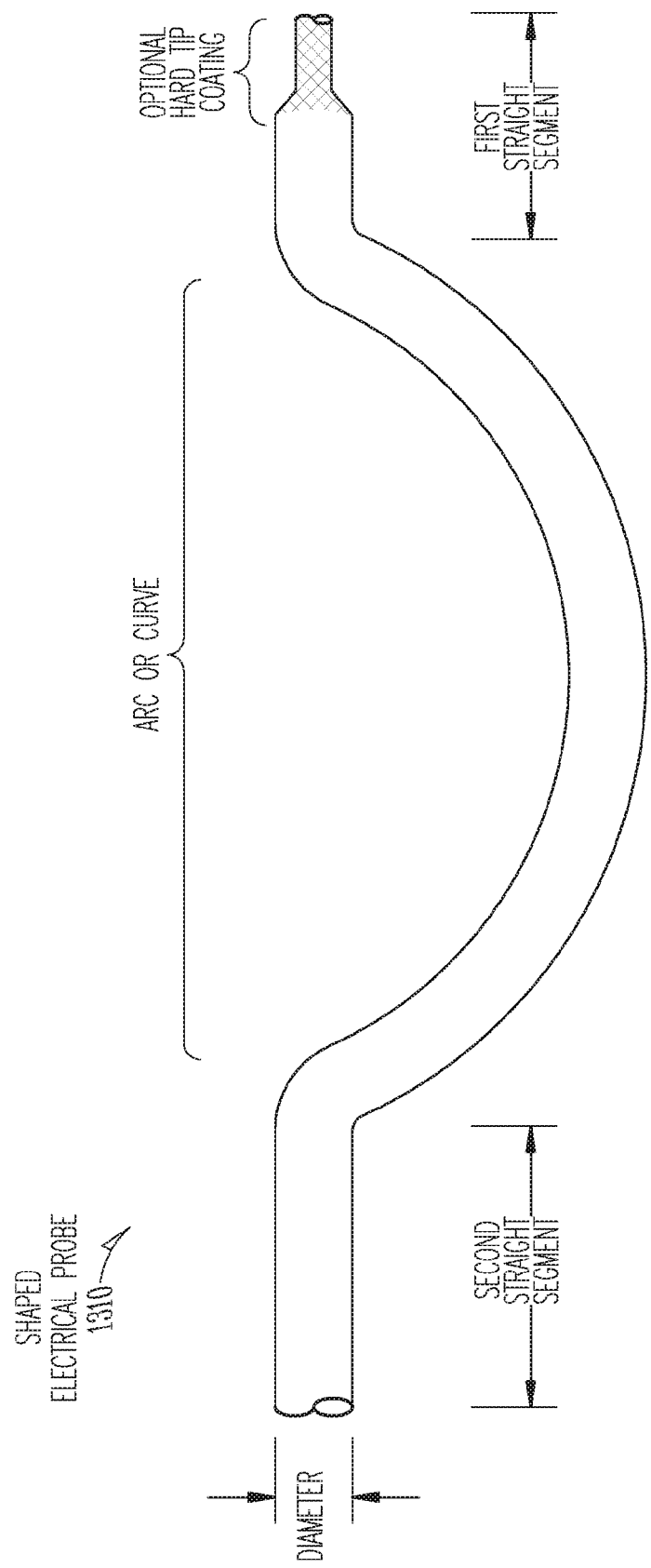
FIG. 13 illustrates a second embodiment of a shaped electrical probe.

FIG. 13 illustrates a second embodiment of a shaped electrical probe 1310. The shaped electrical probe has a length of at least about 500 μm up to many thousands of micrometers, or even longer. The shaped electrical probe has a round or substantially circular cross section with a diameter or other cross-sectional dimension that in some embodiments is no more than 50 μm, and in other embodiments is no more than 25 μm. This embodiment of the shaped electrical probe has central arc or curve. The shaped electrical probe includes a first straight segment between the terminal end intended to contact electrical contacts and the arc or curve, a second straight segment between the other terminal end of the electrical probe and the arc or curve, and the arc or curve between the first and second straight segments. In some embodiments, the arc or curve may extend across at least a majority of a length of the electrical probe. A terminal end of the shaped electrical probe intended to contact electrical contacts has a hard tip. The hard tip may include an extension of a central core of the electrical probe that is coated or covered with a hard tip coating. An example of such a hard tip coating is rhodium. Alternatively, the terminal end may be tapered as previously described with or without such a hard tip coating. Other aspects of the shaped electrical probe may be as described elsewhere herein.

These are just a few illustrative examples of suitable shaped electrical probes. Other shaped probes known in the arts are also suitable. Thus a system including a composite wire material that is comprised of a high strength core wire that is electrically and thermally conductive and that includes a protective coating addresses the above-mentioned concerns.

However, refractory metals such as tungsten and molybdenum are not amenable to soft soldering and welding applications, making attaching these materials to substrates, such as organic and ceramic substrates, difficult. Accordingly, approaches described herein accommodate composite wire and wire assembly construction. Examples provide a selected alloys that are compatible with soldering, and assembly configurations that are compatible with the creation of a large number of composite wire probes.

For example, a composite wire can have a nickel barrier layer and a gold adhesion layer, with silver and gold to enable reflow soldering with lead-free (SAC) and eutectic solders. Nickel and silver layers can be disposed onto wire, such as a tungsten wire core, to enable soldering with tin-silver-lead based solders to the wire. This is an improvement over a single gold layer which can be insufficient for solderability as gold can dissolve in the tin-rich solders during reflow, with remaining solder resisting wetting and bonding to tungsten.

Silver and tin can be the primary metallurgy that provides for tungsten wire to be permanently attached to a package or ceramic substrate. However, strong adhesion of silver to a tungsten core wire is desired. A nickel/gold barrier layer can significantly improve the adhesion of silver plating to tungsten wire core. Cold drawing silver plated tungsten wire can work harden the composite wire probe. A gold outer finish layer can protect wire from oxidation under sort test temperature conditions.

It is possible to use gold only plated tungsten wire with 80Au20Tin solder. However, the cost can be greater than approaches using traditional solders. Further, higher reflow temps of greater than 280 degrees C. are not as compatible with material properties of organic substrates. Thus, the following examples describe a composite wire that includes an intermediate layer, such as a low electrical resistivity layer.

FIG. 14A is a cross-section side view of a probe disposed nearby a cavity, with solder paste yet to be melted, according to an embodiment. A substrate 1402, such as a PCB, can include a conductive trace 1403. The trace can include a copper base 1405 and a plating 1407 such as a nickel plating, although other configurations are possible, including configurations in which a top-facing surface of the conductive trace is formed of a metal including copper, nickel and alloys thereof.

One or more layer(s) 1404 can be disposed, such as through lamination, onto the substrate 1402. Methods of disposing a laminate are discussed herein. The layers can be a photo-imageable dry-film laminate. They can be a polyimide surface layer. They can serve as a mask.

The laminate can define one or more cavities 1406. One or more cavities can be cylindrical. An electrical probe 1408, such as the probes described above, is for deposition into the cavity 1406. A layer such as a low-cost build-up dry-film laminate layer can retain sufficient solder paste 1410 for ing a composite wire to substrates, such as those with 45 um first level interconnect (FLI) pitch. The cavity 1406 can have a diameter of around twice a diameter of the electrical probe 1408, but the present subject matter is not so limited. In an example, the probe is at least 50 μm in diameter, and the cavity is large enough to receive the probe. In an example, the cavity is around twice the size in diameter of the probe.

Surface area for soldering is increased by providing a thicker solder mask built up on the substrate. A thickness of the layer such as a laminate layer can be greater than or equal to around one half a diameter of the electrical probe. An example can include laminating a lamination layer onto the substrate to a depth of at least 30 μm. Existing organic packages and ceramic space transformers can have a solder mask thickness of 15 μm to 8 μm, respectively-which may not be sufficient for attaching wire probes. Masks that are around 35 μm to 40 μm thicker perform better at 130 to 90 μm FLI pitch, enabling strong joint integrity between composite wire and bond pad. This thickness exceeds existing thicknesses, which are less than 30 μm in total.

FIG. 14B is a cross-section side view of a probe disposed in a cavity, with solder paste melted, according to an embodiment. Solder paste 1410, such as solder paste, can be melted, such as via reflow, to fill the cavity 1406. The solder paste can electrically couple the probe 1408 to the trace 1403. The solder paste can mechanically couple the probe 1408 to the electrical probe assembly 1400. The solder paste 1410 can couple the electrical probe 1408 to a conductive trace 1403. Solder paste can fill the cavity 1406 and can be coupled to the electrical probe 1408 inside the cavity, along portions of the probe 1408 that are not abutting the conductive trace. The solder paste can be disposed between the electrical probe 1408 and the layer 1404. Accordingly, the layer can provide a stress relief for the probe-to-trace bond, decreasing the mechanical stress on the bond during testing, leading to longer life for the electrical probe. The approach can provide for an array including a large number of test contactors.

Figure 15:
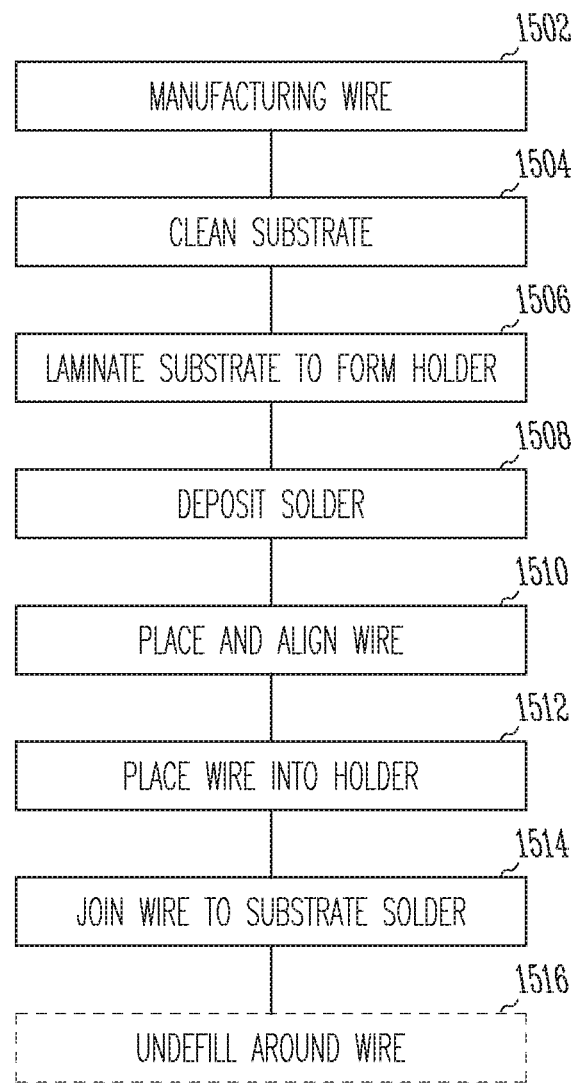
FIG. 15 is a method of assembling an electrical probe assembly, according to an embodiment.

FIG. 15 is a method of assembling an electrical probe assembly, according to an embodiment. At 1502, probe wire can be manufactured, as referenced herein. For 90 μm pitch FLI the manufacturing of 50 um diameter composite wire material with nominal dimensions can include around 35 μm diameter tungsten core wire coated with 0.1 um Ni barrier layer. The example can include an around 6.5 μm silver plating for electrical and thermal conductivity. The example can include an around 1.0 μm gold protective layer. For 45 μm FLI pitch, wire dimensions and plating thicknesses can be reduced to 45 μm FLI pitch, and a 25 um wire diameter can be used with an around 16 μm tungsten core diameter, an around 4 μm thick silver plating and an around 0.5 μm gold plating.

At 1504, the substrate can be cleaned. For example, an organic package substrates, such as a substrate without microball attached to first level interconnect (FLI) or sort die probe card space transformers can be cleaned. The cleaning can promote adhesion of a laminate, such as a dry-film laminate build-up layer. This can aid in the creation of a substrate with a built-up solder mask or polyimide surface layer.

At 1506, an example can include creating at least one cavity in the lamination layer. A dry-film lamination and photolithography process can be used to create thick solder mask of 30 μm to 45 μm in thickness. Such films can be laminated to top surface of a package or ceramic substrate using a hot rolling drum laminator. Standard lithographic techniques can be used to pattern the dry-film with FLI layout and create openings in the dry-film. These openings can accommodate a larger volume of solder paste for probe attachment than existing approaches.

At 1508, solder paste can be disposed over the lamination layer proximal the cavity. Solder paste, such as type 6/7 solder paste, paste can be printed directly onto dry-film modified substrates. A polyurethane squeegee can be used to smear the paste into the openings or cavities.

At 1510, at least one electrical probe can be disposed into a holder. A holder can hold a large number of contactors or probes in alignment so that they can be placed into mating number of cavities.

At 1512, solder paste can be melted to join at least one probe to the conductive trace of a substrate and to fill the at least one cavity with solder paste. The holder can encourage a contactor can be mated to a corresponding cavity, and ultimately to the trace, such as during a reflow process.

At 1514, in an optional step, an alignment layer can surround the probes and can rest on the substrate. An underfill can be disposed between the alignment layer and the laminate to further add mechanical reinforcement to the probe/substrate bond. Accordingly, an example includes disposing a guide over the lamination layer, including at least one guide opening, over the layer, with the at least one guide opening in alignment with the at least one cavity in the lamination layer.

Figure 16:
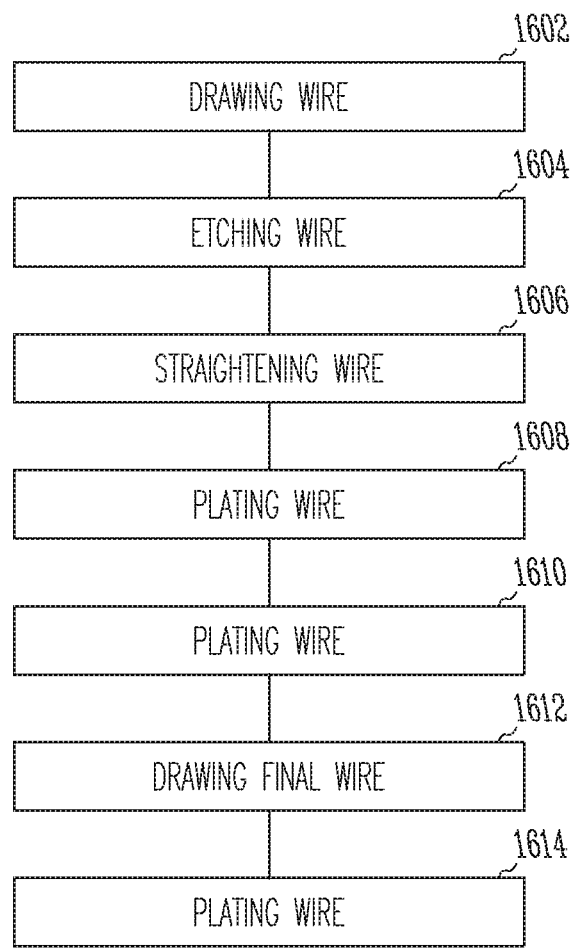
FIG. 16 is a method of forming a wire, according to an embodiment.

FIG. 16 is a method of forming a wire, according to an embodiment. At 1602, the method includes drawing wire. A tungsten wire can be drawn, such as to a nominal diameter. At 1604, the method includes etching the wire. Etching can be used to promote nickel plating adhesion. At 1606, the method includes straightening the wire. Wire can be straightened to anneal to selected mechanical strengths. At 1608, the method includes plating the wire. Plating can add nickel and/or gold to add a barrier for intermolecular coverage (IMC). The plating can promote adhesion of silver. At 1610, the method includes plating the wire. Silver can be plated to add an electrically and thermally conductive layer. The layer can enable solderability with tin-silver-lead solder pastes. At 1612, the method includes drawing the final wire. This can create a wire of uniform cross-section along a selected distance. At 1614, the method plating the wire. Gold can be plated onto the wire to add a finish layer to resist oxidation.

Figure 17A:
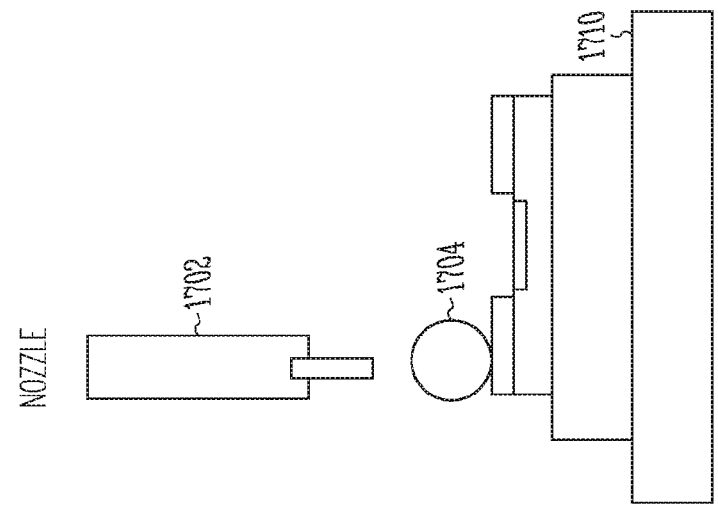
FIG. 17A is first step in disposing solder over a lamination, according to an embodiment.
Figure 17B:
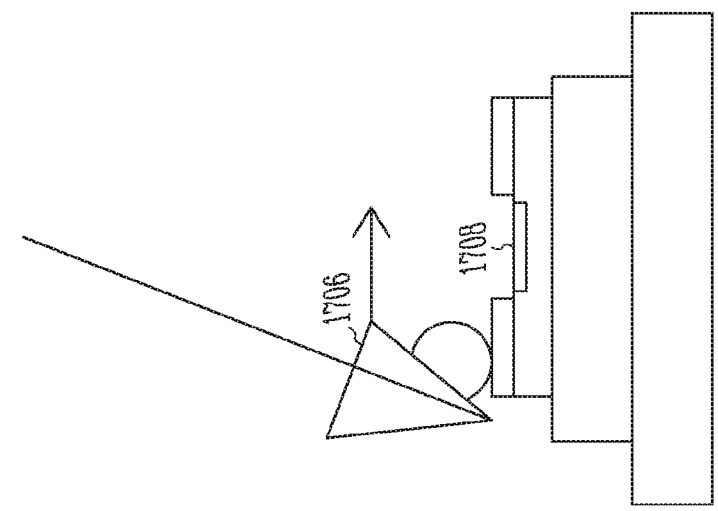
FIG. 17B is second step in disposing solder over a lamination, according to an embodiment.
Figure 17C:
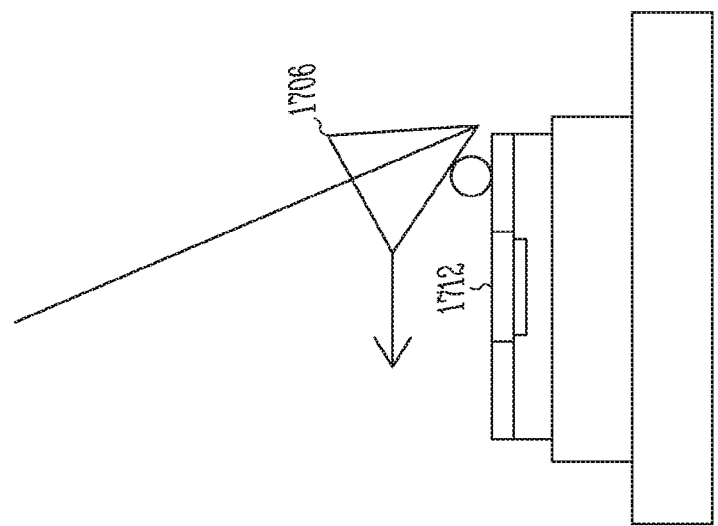
FIG. 17C is third step in disposing solder over a lamination, according to an embodiment.

FIGS. 17A-D show steps in disposing solder paste over a lamination, according to an embodiment. The illustration shows an optional approach to 1508 in FIG. 15. A nozzle 1702 can deposit flowable solder paste 1704. A squeegee 1706 can wipe the solder paste into a cavity 1708. As illustrated in FIG. 17C, it can return over the cavity to improve filling of the cavity with the solder paste.

FIG. 18A-D show steps in joining a wire to a trace, according to an embodiment. A clamp 1802 can hold a guide 1804 in place. A probe 1806 can be inserted into a cavity. The probe 1806 can be held in alignment with other probes using a holder 1808. An oven 1812 can be used to flow the solder paste around the probe 1806 to bond the probe 1806 to a trace of the substrate 1810. A nozzle 1814 can dispense underfill, such as an epoxy, that can function as a capillary underfill (CUF) and fill the gap 1816 between the guide 1801 and the substrate 1810.

Figure 19A:
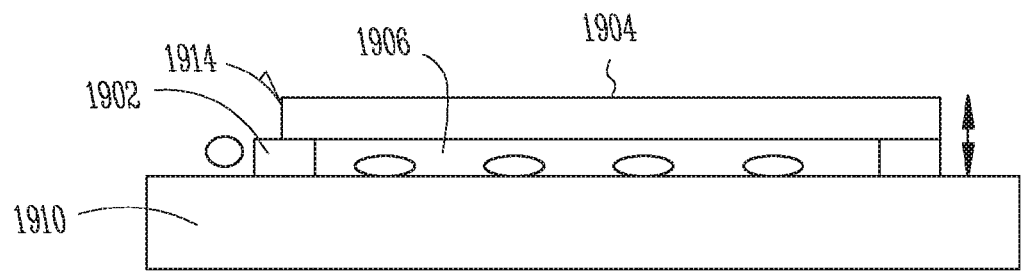
FIG. 19A is front view of an electrical probe assembly before underfill, according to an embodiment.
Figure 19B:
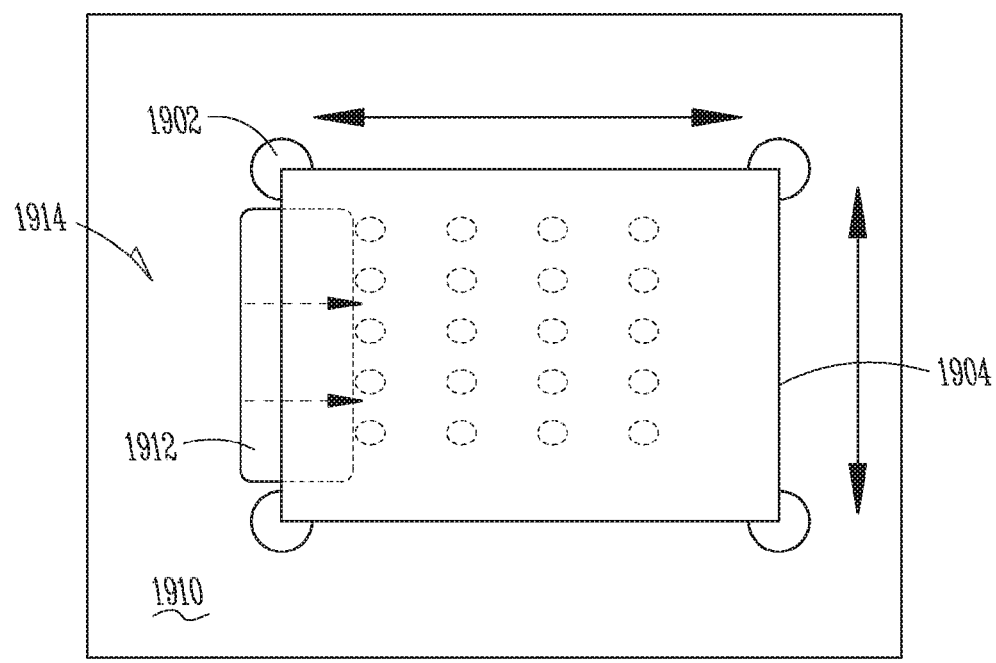
FIG. 19B is top view of the electrical probe assembly of FIG. 19A, during underfill, according to an embodiment.

An example can include an alignment layer can be disposed over the layer, the alignment layer including a guide opening in alignment with the cavity. FIG. 19A is front view of an electrical probe assembly before underfill, according to an embodiment. FIG. 19B is top view of the electrical probe assembly of FIG. 19A, during underfill, according to an embodiment. Pads 1902 can elevate the guide 1904 to define a gap 1906 between the alignment layer 1904 and the layer 1910. Underfill 1912 can be disposed at least partially in the gap, such as via capillary action. CUF 1914 can be dispensed on one side of the alignment layer 1904.

Figure 20:
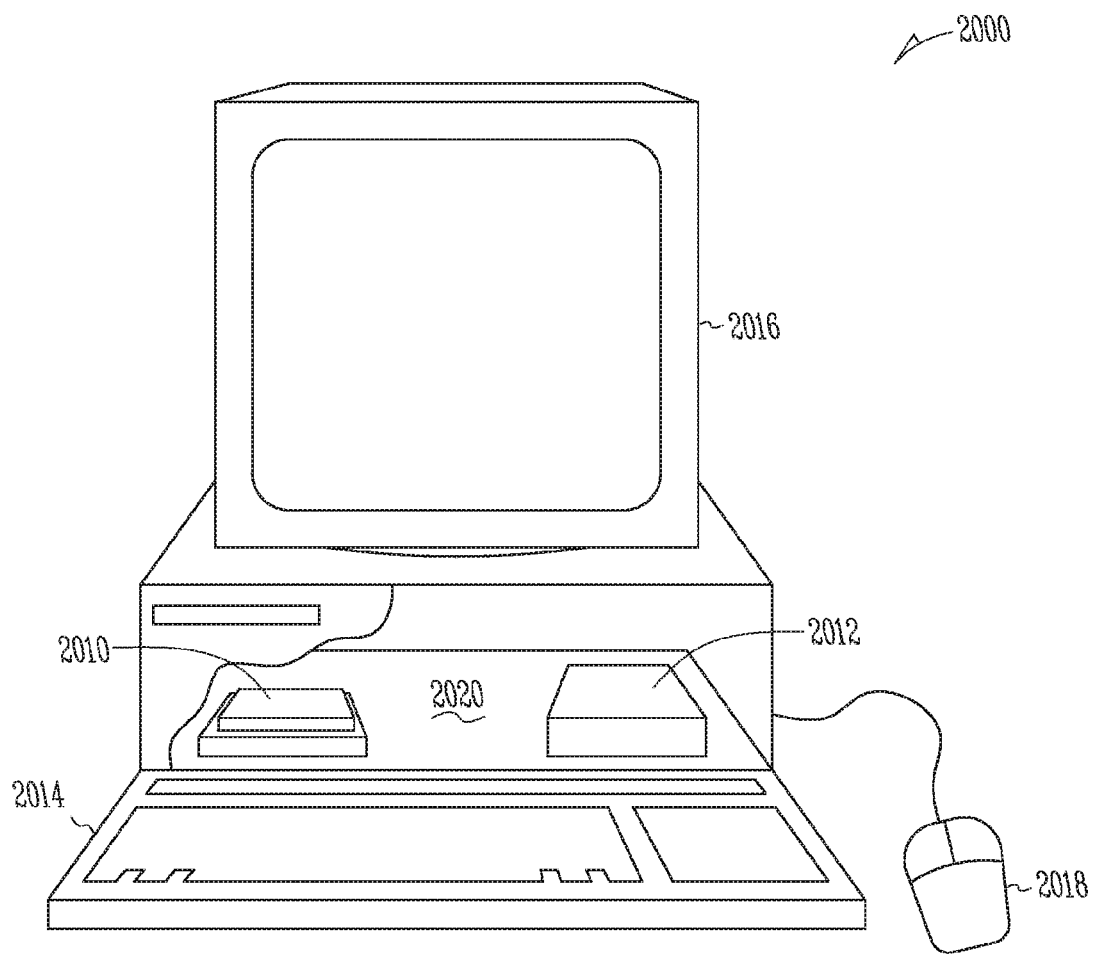
FIG. 20 depicts a computing system according to an embodiment.

FIG. 20 depicts a computing system 2000 according to an embodiment. One or more of the foregoing embodiments, such as those manufactured according to a foregoing process, can be utilized in conjunction with a computing system, such as computing system 2000 of FIG. 20. An electrical probe assembly manufactured according to a method embodiment alone or in combination with any other embodiment can be referred to as an example(s) configuration.

The computing system 2000 can include processor, which can be enclosed in an IC chip package 2010, a data storage system 2012, input device such as a keyboard 2014, and output device such as a monitor 2016. The computing system 2000 can include a processor that processes data signals and may include, for example, a microprocessor available from INTEL CORPORATION. In addition to the keyboard 2014, the computing system 2000 can include another user input device such as a mouse 2018.

The computing system 2000 embodying components in accordance with the claimed subject matter can include any system that utilizes a microelectronic device system, which may include, for example, the electrical probe assembly assemblies described above, such as those manufactured according to a method example, which can be coupled to data storage such as dynamic random access memory (DRAM), polymer memory, flash memory, and phase-change memory. Certain example(s) can be coupled to any combination of these by being coupled to a processor. Data storage can include an embedded DRAM cache on a die. Example(s) configuration coupled to the processor can be part of a system with an example(s) configuration coupled to the data storage of the DRAM cache. Example(s) configuration can be coupled to the data storage system 2012.

In an example, the computing system 2000 can also include a die that contains a digital signal processor (DSP), a micro controller, an application specific integrated circuit (ASIC), or a microprocessor. An example(s) configuration can be coupled to any combination of these by being coupled to a processor. For an example, a DSP can be part of a chipset that can include a stand-alone processor and the DSP as separate parts of the chipset on a board 2020. An example(s) configuration can be coupled to the DSP and a separate example(s) configuration can be present that can be coupled to the processor in the IC chip package 2010. Additionally in an example, an example(s) configuration can be coupled to a DSP that can be mounted on the same board 2020 as the IC chip package 2010. An example(s) configuration can be combined as set forth with respect to the computing system 2000, in combination with an example(s) configuration as set forth by the various examples of the electrical probe assembly assemblies manufactured according to a method example within this disclosure and their equivalents.

Examples set forth in this disclosure can be applied to devices and apparatuses other than a traditional computer. For example, a die can be packaged with an example(s) configuration and placed in a portable device such as a wireless communicator or a hand-held device such as a smart phone, a personal data assistant and the like. Another example can be a die that can be packaged with an example(s) configuration and placed in a vehicle such as an automobile, a locomotive, a watercraft, an aircraft, or a spacecraft.

FIG. 21 illustrates one embodiment of a computer system 2150. The computer system (also referred to as the electronic system) as depicted and integrated circuits thereof can be tested with probes disclosed herein. The computer system may be a mobile device such as a netbook computer. The computer system may be a mobile device such as a wireless smart phone. The computer system may be a desktop computer. The computer system may be a hand-held reader. The computer system may be a server system. The computer system may be a supercomputer or high-performance computing system.

In an embodiment, the electronic system is a computer system that includes a system bus 2120 to electrically couple the various component blocks of the electronic system. The system bus is a single bus or any combination of busses according to various embodiments. The electronic system includes a voltage source 2130 that provides power to the integrated circuit 2110. In some embodiments, the voltage source supplies current to the integrated circuit through the system bus.

The integrated circuit is electrically coupled to the system bus and includes any circuit, or combination of circuits according to an embodiment. In an embodiment, the integrated circuit includes a processor 2112 that can be of any type. As used herein, the processor may mean any type of circuit such as, but not limited to, a microprocessor, a microcontroller, a graphics processor, a digital signal processor, or another processor. In an embodiment, SRAM embodiments are found in memory caches of the processor. Other types of circuits that can be included in the integrated circuit are a custom circuit or an application-specific integrated circuit (ASIC), such as a communications circuit 2114 for use in wireless devices such as cellular telephones, smart phones, pagers, portable computers, two-way radios, and similar electronic systems, or a communications circuit for servers. In an embodiment, the integrated circuit includes on-die memory 2116 such as static random-access memory (SRAM). In an embodiment, the integrated circuit includes embedded on-die memory such as embedded dynamic random-access memory (eDRAM).

In an embodiment, the integrated circuit is complemented with a subsequent integrated circuit 2111. Useful embodiments include a dual processor 2113 and a dual communications circuit 2115 and dual on-die memory 2117 such as SRAM. In an embodiment, the dual integrated circuit includes embedded on-die memory such as eDRAM.

In an embodiment, the electronic system also includes an external memory 2140 that in turn may include one or more memory elements suitable to the particular application, such as a main memory 2142 in the form of RAM, one or more hard drives 2144, and/or one or more drives that handle removable media 2146, such as diskettes, compact disks (CDs), digital variable disks (DVDs), flash memory drives, and other removable media known in the art. The external memory may also be embedded memory 2148 such as the first die in an embedded TSV die stack, according to an embodiment.

In an embodiment, the electronic system also includes a display device 2150, an audio output 2160. In an embodiment, the electronic system includes an input device such as a controller 2170 that may be a keyboard, mouse, trackball, game controller, microphone, voice-recognition device, or any other input device that inputs information into the electronic system. In an embodiment, an input device is a camera. In an embodiment, an input device is a digital sound recorder. In an embodiment, an input device is a camera and a digital sound recorder.

EXAMPLES AND NOTES

Example 1 includes subject matter (such as an apparatus, a method, a means for performing acts, or a device readable medium including instructions that, when performed by the device, can cause the device to perform acts) comprising an apparatus including a substrate, including a conductive trace and a laminate layer disposed on top of the conductive trace, the laminate layer defining at least one cavity extending to the conductive trace. An example can include an electrical probe disposed in the cavity, with solder coupling the electrical probe to the conductive trace. An example electrical probe can include a high yield strength wire core including a refractory metal. An example can include a thin oxidation protection layer concentrically disposed around high yield strength wire core and providing an outside surface of the electrical probe, the thin oxidation protection layer including predominantly one or more materials selected from gold, platinum, ruthenium, rhodium, palladium, osmium, iridium, chromium, and combinations thereof. In an example solder fills the cavity and is coupled to the electrical probe inside the cavity, disposed between the electrical probe and the laminate layer.

Example 2 can include, or can optionally be combined with the subject matter of Example 1 wherein a low electrical resistivity layer is disposed concentrically around the high yield strength wire core between the high yield strength core and the thin oxidation protection layer, the a low electrical resistivity layer including predominantly one or more materials selected from silver, gold, copper, and combinations thereof.

Example 3 can include, or can optionally be combined with the subject matter of one or any combination of Examples 1 through 2 wherein the solder is formed of tin, silver and copper.

Example 4 can include, or can optionally be combined with the subject matter of one or any combination of Examples 1 through 3 wherein the solder is lead-free solder.

Example 5 can include, or can optionally be combined with the subject matter of one or any combination of Examples 1 through 4 wherein high yield strength wire core is formed of tungsten, the low electrical resistivity layer is formed of silver, and the high yield strength wire core and low electrical resistivity layer are cold drawn together.

Example 6 can include, or can optionally be combined with the subject matter of one or any combination of Examples 1 through 5 to include a first thin isolation layer concentrically disposed between the high yield strength wire core and the low electrical resistivity layer, the first thin isolation layer having a thickness of between 0.1 to 0.6 µm, the first thin isolation layer including predominantly one or more materials selected from nickel, gold, cobalt, and combinations thereof.

Example 7 can include, or can optionally be combined with the subject matter of one or any combination of Examples 1 through 6 wherein the thin oxidation protection layer has a thickness of between 0.1 and 0.6 µm.

Example 8 can include, or can optionally be combined with the subject matter of one or any combination of Examples 1 through 7 to include a second thin isolation layer concentrically disposed between the low electrical resistivity layer and the thin oxidation protection layer, the second thin isolation layer having a thickness of between 0.1 to 0.6 µm, the second thin isolation layer including predominantly one or more materials selected from nickel, cobalt, and combinations thereof.

Example 9 can include, or can optionally be combined with the subject matter of one or any combination of Examples 1 through 8 wherein the low electrical resistivity layer has an electrical resistivity of no more than $2 \times 10\Omega 8$ Ohm-meters ($\Omega$-m).

Example 10 can include, or can optionally be combined with the subject matter of one or any combination of Examples 1 through 9 wherein the probe is arranged such that a diameter of the electrical probe that is no more than 50 micrometers (µm).

Example 11 can include, or can optionally be combined with the subject matter of one or any combination of Examples 1 through 10 wherein the probe is arranged such that between 60% to 85% of the diameter is provided by the high yield strength wire core.

Example 12 can include, or can optionally be combined with the subject matter of one or any combination of Examples 1 through 11 wherein the probe is arranged such that between 10 to 30% of the diameter is provided by the low electrical resistivity layer.

Example 13 can include, or can optionally be combined with the subject matter of one or any combination of Examples 1 through 12 wherein a diameter of the electrical probe is no more than 25 µm.

Example 14 can include, or can optionally be combined with the subject matter of one or any combination of Examples 1 through 13 wherein the low electrical resistivity layer includes predominantly silver.

Example 15 can include, or can optionally be combined with the subject matter of one or any combination of Examples 1 through 14 wherein between 65 to 80% of a diameter is provided by the high yield strength wire core, and wherein between 15 to 25% of the diameter is provided by the low electrical resistivity layer.

Example 16 can include, or can optionally be combined with the subject matter of one or any combination of Examples 1 through 15 to include. An example can include a first thin isolation layer concentrically disposed between the high yield strength wire core and the low electrical resistivity layer, the first thin isolation layer having a thickness of between 0.1 to 0.6 µm, the first thin isolation layer including predominantly one or more materials selected from nickel, cobalt, and combinations thereof. An example can include a thin oxidation protection layer concentrically disposed around the low electrical resistivity layer and providing an outside surface of the electrical probe, the thin oxidation protection layer having a thickness of between 0.1 and 0.6 µm, the thin oxidation protection layer including predominantly one or more materials selected from gold, platinum, ruthenium, rhodium, palladium, osmium, iridium, chromium, and combinations thereof. An example can include a second thin isolation layer concentrically disposed between the low electrical resistivity layer and the thin oxidation protection layer, the second thin isolation layer having a thickness of between 0.1 to 0.6 µm, the second thin isolation layer including predominantly one or more materials selected from nickel, cobalt, and combinations thereof.

Example 17 can include, or can optionally be combined with the subject matter of one or any combination of Examples 1 through 16 wherein the solder is formed of gold and tin.

Example 18 can include, or can optionally be combined with the subject matter of one or any combination of Examples 1 through 17 wherein the solder is around 80 percent gold and 20 percent tin.

Example 19 can include, or can optionally be combined with the subject matter of one or any combination of Examples 1 through 18 wherein the laminate layer is a photoimageable dry-film laminate.

Example 20 can include, or can optionally be combined with the subject matter of one or any combination of Examples 1 through 19 wherein the laminate layer is a solder mask.

Example 21 can include, or can optionally be combined with the subject matter of one or any combination of Examples 1 through 20 wherein the cavity is cylindrical and has a diameter around twice a diameter of the electrical probe.

Example 22 can include, or can optionally be combined with the subject matter of one or any combination of Examples 1 through 21 wherein a thickness of the laminate layer is greater than or equal to around one half a diameter of the electrical probe.

Example 23 can include, or can optionally be combined with the subject matter of one or any combination of Examples 1 through 22 wherein the substrate includes a printed circuit board.

Example 24 can include, or can optionally be combined with the subject matter of one or any combination of Examples 1 through 23, comprising an alignment layer disposed over the laminate layer, the alignment layer including a guide opening in alignment with the cavity.

Example 25 can include, or can optionally be combined with the subject matter of one or any combination of Examples 1 through 24 wherein there is a gap between the alignment layer and the laminate layer. In an example underfill can be disposed at least partially in the gap.

Example 26 can include, or can optionally be combined with the subject matter of one or any combination of Examples 1 through 25 wherein the high yield strength wire core includes predominantly one or more materials selected from tungsten, tungsten-copper alloy, tungsten-nickel alloy, beryllium-copper alloy, molybdenum, stainless steel, and combinations thereof, the high yield strength wire core having a yield strength of at least 1 gigapascal at a temperature of 250° C.

Example 27 can include, or can optionally be combined with the subject matter of one or any combination of Examples 1 through 26 wherein the high yield strength wire core includes predominantly tungsten.

Example 28 can include, or can optionally be combined with the subject matter of one or any combination of Examples 1 through 27 wherein the electrical probe has an electrical resistivity of no more than 3×10-8 Ω-m, and wherein the electrical probe has a yield strength of at least 500 MPa.

Example 29 can include, or can optionally be combined with the subject matter of one or any combination of Examples 1 through 28 wherein the electrical probe has one of. An example can include a first straight segment, a second straight segment, and a bend between the first and second straight segments, an inner bend angle of the bend ranging from 100-105 degrees. An example can include a first straight segment, a second straight segment, and an arc between the first and second straight segments.

Example 30 includes subject matter (such as an apparatus, a method, a means for performing acts, or a device readable medium including instructions that, when performed by the device, can cause the device to perform acts) comprising a method of manufacturing a probe assembly. An example can include cleaning a substrate that includes a conductive trace. An example can include laminating a lamination layer onto the substrate to a depth of at least 30 µm. An example can include creating at least one cavity in the lamination layer. An example can include disposing solder over the lamination layer proximal the cavity. An example can include disposing at least one electrical probe into a holder. An example electrical probe can include a high yield strength wire core including a refractory metal. An example can include a low electrical resistivity layer concentrically around the high yield strength wire core, the low electrical resistivity layer including predominantly one or more materials selected from silver, gold, copper, and combinations thereof. An example can include a thin oxidation protection layer concentrically disposed around the low electrical resistivity layer and providing an outside surface of the electrical probe, the thin oxidation protection layer including predominantly one or more materials selected from gold, platinum, ruthenium, rhodium, palladium, osmium, iridium, chromium, and combinations thereof. An example can include disposing the at least one electrical probe proximal the solder. An example can include melting the solder to join the at least one probe to the conductive trace and to fill the at least one cavity.

Example 31 can include, or can optionally be combined with the subject matter of Example 30 wherein creating at least one cavity in the lamination layer includes creating a pattern of cavities in the lamination layer.

Example 32 can include, or can optionally be combined with the subject matter of one or any combination of Examples 30 through 31 wherein creating the pattern of cavities in the lamination layer includes lithographically creating the pattern of cavities.

Example 33 can include, or can optionally be combined with the subject matter of one or any combination of Examples 30 through 32 wherein disposing at least one electrical probe into a holder in alignment for positioning into respective cavities of the pattern of cavities.

Example 34 can include, or can optionally be combined with the subject matter of one or any combination of Examples 30 through 33 wherein disposing solder over the lamination layer proximal the at least one cavity includes disposing the solder in the at least one cavity.

Example 35 can include, or can optionally be combined with the subject matter of one or any combination of Examples 30 through 34 wherein disposing the solder in the at least one cavity includes squeegeeing the solder into the at least one cavity.

Example 36 can include, or can optionally be combined with the subject matter of one or any combination of Examples 30 through 35 wherein melting the solder includes reflowing the solder.

Example 37 can include, or can optionally be combined with the subject matter of one or any combination of Examples 30 through 36, comprising disposing a guide over the lamination layer, including at least one guide opening, over the layer, with the at least one guide opening in alignment with the at least one cavity in the lamination layer.

Example 38 includes subject matter (such as an apparatus, a method, a means for performing acts, or a device readable medium including instructions that, when performed by the device, can cause the device to perform acts) comprising a method of using a probe assembly to test a wafer. An example can include introducing the wafer into an integrated circuit test system with a plurality electrical contacts of the wafer exposed to the probe assembly. An example can include contacting an exposed electrical contact of the plurality with the probe assembly. A probe assembly can include a substrate, including a conductive trace and a laminate layer disposed on top of the conductive trace, the laminate layer defining a cavity extending to the conductive trace. An example can include an electrical probe disposed in the cavity, with solder coupling the electrical probe to the conductive trace. An example electrical probe can include a high yield strength wire core including a refractory metal. An example can include a low electrical resistivity layer concentrically around the high yield strength wire core, the low electrical resistivity layer including predominantly one or more materials selected from silver, gold, copper, and combinations thereof. An example can include a thin oxidation protection layer concentrically disposed around the low electrical resistivity layer and providing an outside surface of the electrical probe, the thin oxidation protection layer including predominantly one or more materials selected from gold, platinum, ruthenium, rhodium, palladium, osmium, iridium, chromium, and combinations thereof. An example is included wherein the solder fills the cavity and is coupled to the electrical probe inside the cavity, disposed between the electrical probe and the laminate layer. An example can include exchanging an electrical signal between the electrical probe and the exposed electrical contact.

Example 39 can include, or can optionally be combined with the subject matter of Examples 38 wherein the exposed electrical contacts having a pitch of no more than 90 micrometers ($\mu m$).

Example 40 can include, or can optionally be combined with the subject matter of one or any combination of Examples 38 through 40 to include a thin oxidation protection layer concentrically disposed around the low electrical resistivity layer and providing an outside surface of the electrical probe, the thin oxidation protection layer having a thickness of between 0.1 and 0.6 $\mu m$, the thin oxidation protection layer including predominantly one or more materials selected from gold, platinum, ruthenium, rhodium, palladium, osmium, iridium, chromium, and combinations thereof.

Each of these non-limiting examples can stand on its own, or can be combined in various permutations or combinations with one or more of the other examples.

As shown herein, the integrated circuit can be implemented in a number of different embodiments, including a test system, and their equivalents, an electronic system, a computer system, one or more methods of fabricating an integrated circuit, and one or more methods of fabricating an electronic assembly that includes a semiconductor die packaged. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with a thermal interface unit and their equivalents.

Various operations and methods have been described. Some of the methods have been described in a basic form in the flow diagrams, but operations may optionally be added to and/or removed from the methods. In addition, while the flow diagrams show a particular order of the operations according to embodiments, it is to be understood that that particular order is exemplary. Alternate embodiments may optionally perform the operations in different order, combine certain operations, overlap certain operations, etc. Many modifications and adaptations may be made to the methods and are contemplated.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

The above description is intended to be illustrative, and not restrictive. For example, the above-described examples (or one or more aspects thereof) can be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages that have been described and illustrated in order to explain the nature of this invention can be made without departing from the principles and scope of the invention as expressed in the subjoined claims.

What is claimed is:

1. An apparatus, comprising:
a substrate, including a conductive trace and a first layer disposed on top of the conductive trace, the first layer including at least one cavity extending to the conductive trace; and
an electrical probe disposed in the cavity, with solder paste coupling the electrical probe to the conductive trace, the electrical probe comprising:
a high yield strength wire core including a refractory metal; and
a thin oxidation protection layer concentrically disposed around high yield strength wire core and providing an outside surface of the electrical probe, the thin oxidation protection layer including predominantly one or more materials selected from gold, platinum, ruthenium, rhodium, palladium, osmium, iridium, chromium, and combinations thereof,
wherein the solder paste fills the cavity and is coupled to the electrical probe inside the cavity, disposed between the electrical probe and the first layer; and
wherein the first layer is one of a deposited first layer, a first layer that is a photo-imageable dry-film laminate and a spun-on deposited first layer.

2. The apparatus of claim 1, wherein the probe is arranged such that a diameter of the electrical probe that is smaller in diameter than a diameter of the cavity.

3. The apparatus of claim 1, wherein the solder paste can include at least one of gold and tin.

4. The apparatus of claim 3, wherein the solder paste is around 80 percent gold and 20 percent tin.

5. The apparatus of claim 1, wherein the first layer is a solder mask.

6. The apparatus of claim 1, wherein the cavity is cylindrical and has a diameter around twice a diameter of the electrical probe.

7. The apparatus of claim 1, wherein a thickness of the first layer is greater than or equal to around one half a diameter of the electrical probe.

8. The apparatus of claim 1, wherein the substrate is formed of at least one of an organic material, an inorganic material, or a combination thereof.

9. The apparatus of claim 1, comprising an alignment layer disposed over the first layer, the alignment layer including a guide opening in alignment with the cavity.

10. The apparatus of claim 9, wherein there is a gap between the alignment layer and the first layer, and further comprising an underfill disposed at least partially in the gap.

11. The apparatus of claim 1, wherein the high yield strength wire is electrically conductive and possesses a yield stress of at least 1 gigapascal.

* * * * *